US009933257B2

(12) United States Patent
Pershing

(10) Patent No.: US 9,933,257 B2
(45) Date of Patent: Apr. 3, 2018

(54) SYSTEMS AND METHODS FOR ESTIMATION OF BUILDING WALL AREA

(75) Inventor: Chris Pershing, Redmond, WA (US)

(73) Assignee: Eagle View Technologies, Inc., Bothell, WA (US)

( * ) Notice: Subject to any disclaimer, the term of this patent is extended or adjusted under 35 U.S.C. 154(b) by 986 days.

(21) Appl. No.: 13/385,606

(22) Filed: Feb. 3, 2012

(65) Prior Publication Data
US 2013/0202157 A1    Aug. 8, 2013

(51) Int. Cl.
G06K 9/00 (2006.01)
G01B 21/28 (2006.01)
G06F 17/00 (2006.01)
G06F 17/50 (2006.01)
G01C 11/04 (2006.01)

(52) U.S. Cl.
CPC ............. *G01B 21/28* (2013.01); *G01C 11/04* (2013.01); *G06F 17/00* (2013.01); *G06F 17/5004* (2013.01)

(58) Field of Classification Search
None
See application file for complete search history.

(56) References Cited

U.S. PATENT DOCUMENTS

| 2,791,151 | A | 5/1957 | Pennington |
| 3,617,016 | A | 11/1971 | Bolsey |
| 4,096,670 | A | 6/1978 | Fuller |
| 4,344,142 | A | 8/1982 | Diehr, II et al. |
| 5,247,356 | A | 9/1993 | Ciampa |
| 5,379,105 | A | 1/1995 | Iki et al. |
| 5,596,494 | A | 1/1997 | Kuo |
| 5,633,946 | A | 5/1997 | Lachinski et al. |
| 5,633,995 | A | 5/1997 | McClain |

(Continued)

FOREIGN PATENT DOCUMENTS

| AU | 2008230031 B8 | 11/2009 |
| CA | 2191954 A1 | 12/1995 |

(Continued)

OTHER PUBLICATIONS

US 8,315,941, 11/2012, Halper et al. (withdrawn)

(Continued)

*Primary Examiner* — Iman K Kholdebarin
(74) *Attorney, Agent, or Firm* — Dunlap Codding, P.C.

(57) ABSTRACT

A wall area estimation system generates an estimated wall area measurement of a building based on the received roof measurements (e.g., those generated by, received from or found in a three dimensional model of the roof) and a reference distance. The reference distance is a measurement indicative of a distance between a reference point on the roof and a ground surface. This reference distance may be used to determine how for down to extend the walls of the building (e.g., to a ground level) when building a three dimensional digital model of the building to aid in generating wall area measurements. The resulting wall measurements, roof measurements, measurements of areas missing from the wall used to generate a wall estimate report, or a combined roof and wall estimate report including various different identifiers indicating the different features and measurements based on the three dimensional model.

12 Claims, 13 Drawing Sheets

(56) References Cited

U.S. PATENT DOCUMENTS

| | | |
|---|---|---|
| 5,983,010 A | 11/1999 | Murdock et al. |
| 6,323,885 B1 | 11/2001 | Wiese |
| 6,333,749 B1 | 12/2001 | Reinhardt et al. |
| 6,385,541 B1 | 5/2002 | Blumberg et al. |
| 6,396,491 B2 | 5/2002 | Watanabe et al. |
| 6,446,053 B1 | 9/2002 | Elliott |
| 6,496,184 B1 | 12/2002 | Freeman et al. |
| 6,636,803 B1 | 10/2003 | Hartz, Jr. et al. |
| 6,836,270 B2 | 12/2004 | Du |
| 6,980,690 B1 | 12/2005 | Taylor et al. |
| 7,003,400 B2 | 2/2006 | Bryant |
| 7,006,977 B1 | 2/2006 | Attra et al. |
| 7,133,551 B2 | 11/2006 | Chen et al. |
| 7,233,691 B2 | 6/2007 | Setterholm |
| 7,305,983 B1 | 12/2007 | Meder et al. |
| 7,324,666 B2 | 1/2008 | Zoken et al. |
| 7,327,880 B2 | 2/2008 | Tek |
| 7,333,963 B2 | 2/2008 | Widrow et al. |
| 7,343,268 B2 | 3/2008 | Kishikawa |
| 7,373,303 B2 | 5/2008 | Moore et al. |
| 7,424,133 B2 | 9/2008 | Schultz et al. |
| 7,460,214 B2 | 12/2008 | Schiavi |
| 7,487,114 B2 | 2/2009 | Florance et al. |
| 7,500,391 B2 | 3/2009 | Woro |
| 7,509,241 B2 | 3/2009 | Guo et al. |
| 7,515,153 B2 | 4/2009 | Jin et al. |
| 7,519,206 B2 | 4/2009 | Mulet-Parada et al. |
| 7,570,785 B2 | 8/2009 | Breed |
| 7,583,275 B2 | 9/2009 | Neumann et al. |
| 7,629,985 B2 | 12/2009 | McArdle et al. |
| 7,639,842 B2 | 12/2009 | Kelle et al. |
| 7,728,833 B2 | 6/2010 | Verma et al. |
| 7,752,018 B2 | 7/2010 | Rahmes et al. |
| 7,787,659 B2 | 8/2010 | Schultz et al. |
| 7,844,499 B2 | 11/2010 | Yahiro et al. |
| 7,869,944 B2 | 1/2011 | Deaton et al. |
| 7,873,238 B2 | 1/2011 | Schultz et al. |
| 7,991,226 B2 | 8/2011 | Schultz et al. |
| 7,995,799 B2 | 8/2011 | Schultz et al. |
| 7,995,862 B2 | 8/2011 | Tao et al. |
| 8,051,089 B2 | 11/2011 | Gargi et al. |
| 8,068,643 B2 | 11/2011 | Schultz et al. |
| 8,078,436 B2 | 12/2011 | Pershing et al. |
| 8,081,798 B2 | 12/2011 | Paglieroni et al. |
| 8,081,841 B2 | 12/2011 | Schultz et al. |
| 8,131,514 B2 | 3/2012 | Royan et al. |
| 8,145,578 B2 | 3/2012 | Pershing et al. |
| 8,170,840 B2 | 5/2012 | Pershing |
| 8,204,341 B2 | 6/2012 | Schultz et al. |
| 8,209,152 B2 * | 6/2012 | Pershing ............ G06F 17/5004 703/1 |
| 8,229,769 B1 | 7/2012 | Hopkins, III |
| 8,233,666 B2 | 7/2012 | Schultz et al. |
| 8,346,578 B1 | 1/2013 | Hopkins, III et al. |
| 8,352,332 B2 | 1/2013 | Pesicek |
| 8,385,672 B2 | 2/2013 | Giuffrida et al. |
| 8,401,222 B2 | 3/2013 | Thornberry et al. |
| 8,417,061 B2 * | 4/2013 | Kennedy ............ G06K 9/0063 382/282 |
| 8,526,733 B2 | 9/2013 | Tilton |
| 8,538,918 B1 | 9/2013 | Pearcy et al. |
| 8,825,454 B2 * | 9/2014 | Pershing ............ G06F 17/5004 703/1 |
| 9,135,737 B2 * | 9/2015 | Pershing ............ G06F 17/5004 |
| 2002/0101594 A1 | 8/2002 | Slatter |
| 2002/0143669 A1 | 10/2002 | Scheer |
| 2002/0154174 A1 | 10/2002 | Redlich et al. |
| 2003/0028393 A1 | 2/2003 | Coulston et al. |
| 2003/0103651 A1 | 6/2003 | Novak |
| 2003/0171957 A1 | 9/2003 | Watrous |
| 2003/0233310 A1 | 12/2003 | Stavrovski |
| 2005/0267657 A1 | 12/2005 | Devdhar |
| 2005/0288959 A1 | 12/2005 | Eraker et al. |
| 2006/0137736 A1 | 6/2006 | Nishitani et al. |
| 2006/0169775 A1 | 8/2006 | Gray et al. |
| 2006/0200311 A1 | 9/2006 | Arutunian et al. |
| 2006/0232605 A1 | 10/2006 | Imamura |
| 2006/0262112 A1 | 11/2006 | Shimada |
| 2006/0265287 A1 | 11/2006 | Kubo |
| 2007/0179757 A1 | 8/2007 | Simpson |
| 2007/0220174 A1 | 9/2007 | Abhyanker |
| 2008/0089610 A1 | 4/2008 | Tao et al. |
| 2008/0162380 A1 | 7/2008 | Suga et al. |
| 2008/0204570 A1 | 8/2008 | Schultz et al. |
| 2008/0208637 A1 | 8/2008 | McKay et al. |
| 2008/0221843 A1 | 9/2008 | Shenkar et al. |
| 2008/0231700 A1 | 9/2008 | Schultz et al. |
| 2008/0262789 A1 | 10/2008 | Pershing et al. |
| 2009/0085915 A1 | 4/2009 | Kelley et al. |
| 2009/0132436 A1 * | 5/2009 | Pershing ............... G06Q 30/02 705/400 |
| 2009/0141020 A1 | 6/2009 | Freund et al. |
| 2009/0160856 A1 * | 6/2009 | Hoguet ......................... 345/420 |
| 2009/0265193 A1 | 10/2009 | Collins et al. |
| 2009/0304227 A1 | 12/2009 | Kennedy et al. |
| 2010/0034483 A1 | 2/2010 | Giuffrida et al. |
| 2010/0070309 A1 | 3/2010 | Deede et al. |
| 2010/0110074 A1 * | 5/2010 | Pershing ............ G06F 17/5004 345/423 |
| 2010/0179787 A2 | 7/2010 | Pershing et al. |
| 2010/0241406 A1 | 9/2010 | Rahmes et al. |
| 2011/0086201 A1 | 4/2011 | Shiao et al. |
| 2011/0096083 A1 | 4/2011 | Schultz |
| 2011/0187713 A1 | 8/2011 | Pershing et al. |
| 2011/0205245 A1 | 8/2011 | Kennedy et al. |
| 2011/0216962 A1 | 9/2011 | Kim et al. |
| 2011/0282763 A1 * | 11/2011 | Pesicek ............ G06Q 30/0635 705/27.1 |
| 2011/0288816 A1 * | 11/2011 | Thierman ............ G01B 11/002 702/151 |
| 2012/0007982 A1 | 1/2012 | Giuffrida et al. |
| 2012/0035887 A1 | 2/2012 | Augenbraun et al. |
| 2012/0066187 A1 | 3/2012 | Pearcy et al. |
| 2012/0170797 A1 | 7/2012 | Pershing et al. |
| 2012/0191424 A1 | 7/2012 | Pershing et al. |
| 2012/0209782 A1 | 8/2012 | Pershing et al. |
| 2012/0223965 A1 | 9/2012 | Pershing |
| 2012/0224770 A1 | 9/2012 | Strassenburg-Kleciak |
| 2013/0202157 A1 | 8/2013 | Pershing |
| 2013/0204575 A1 | 8/2013 | Pershing |
| 2013/0211790 A1 | 8/2013 | Loveland et al. |
| 2013/0216089 A1 | 8/2013 | Chen et al. |
| 2013/0226515 A1 | 8/2013 | Pershing et al. |
| 2013/0262029 A1 | 10/2013 | Pershing |
| 2013/0304617 A1 | 11/2013 | Wilkinson et al. |
| 2013/0346020 A1 | 12/2013 | Pershing |
| 2014/0046627 A1 | 2/2014 | Pershing et al. |
| 2014/0279593 A1 | 9/2014 | Pershing |
| 2015/0370928 A1 * | 12/2015 | Pershing ............ G06F 17/5004 703/1 |

FOREIGN PATENT DOCUMENTS

| | | |
|---|---|---|
| CN | 102194120 A | 9/2011 |
| DE | 198 57 667 A1 | 8/2000 |
| EP | 1 010 966 B1 | 10/2002 |
| EP | 1 619 610 A1 | 1/2006 |
| EP | 2 251 833 A2 | 11/2010 |
| WO | 00/29806 A2 | 5/2000 |
| WO | 2005/124276 A2 | 12/2005 |
| WO | 2006/040775 A2 | 4/2006 |
| WO | 2006/090132 A2 | 8/2006 |
| WO | 2011/094760 A2 | 8/2011 |

OTHER PUBLICATIONS

Dorninger, A Comprehensive Automated 3D Approach for Building Extraction, Reconstruction, and Regularization from Airborne Laser Scanning Point Clouds, 2008, Sensors 2008, 8, 7323-7343; DOI: 10.3390/s8117323.*

Forlani, Buildng reconstruction and visualization from LIDAR data, the International Archives of the Photogrammetry, Remote Sensing

(56) References Cited

OTHER PUBLICATIONS and Spatial Information Sciences, vol. XXXIV, Part 5/W12, 2003.*
Hatter, "http://homeguides.sfgate.com/figure-square-footage-painting-outside-house-8721.html" Dec. 2, 2010.*
Public information—Wikihow, Jul. 11, 2011, Wikihow website "how to cacluate amount of paint to paint a room".*
Public information—brolafountaine, Generating exterior walls from roofs in Sketch (Part 1)—Xactimate 27—Jan. 17, 2011 video.*
Public information—by Hatter, How do I Figure Square Footage for Painting the Outside of a House? Dec. 2, 2010.*
Pershing, "Systems and Methods for Estimation of Building Floor Area," Notice of Allowance for U.S. Appl. No. 13/757,712, dated Dec. 26, 2013, 18 pages.
Pershing, "Systems and Methods for Estimation of Building Wall Area," Office Action for U.S. Appl. No. 13/757,694, dated Jan. 15, 2014, 34 pages.
Transcription of points of potential interest in the attached YouTube video titled: "Pictometry Online Demo," retrieved on Feb. 10, 2010, 1 page.
YouTube, "Pictometry Online Demo," DVD, Feb. 25, 2010.
"3D Reconstruction," retrieved Oct. 25, 2013, from http://www8cs.umu.se/kurser/TDBD19/V705/reconstruct-4.pdf, 5 pages.
"8. Epipolar Geometry and the Fundamental Matrix," retrieved Oct. 25, 2013, from http://www.robtos.ox.ac.uk/~vgg/hzbook/hzbook1/HZepipolar.pdf, 25 pages.
"AeroDach® Online Roof Evaluation Standard Delivery Format and 3D Data File," Document Version 01.00.2002 with alleged publication in 2002, 21 pages.
"AeroDach® Online Dachauswertung: Standardlieferformat und 3D-Datensatz," Aerowest GMBH,Version 01.00.2002, 6 pages.
"AERODACH® Online Roof Analysis: Standard Delivery Format and 3D Dataset," AEROWESTGmbH, Version as of 00-01-2002, 6 pages.
"AppliCad Software and EagleView® Technologies Partner for Metal Roofing Contractors," EagleView Technologies and AppliCad Software, retrieved from blog.eagleview.com/?=614 on Feb. 1, 2012, 2 pages.
"Definitions of Surveying and Associated Terms," American Congress on Surveying and Mapping, reprinted 1989, p. 3, 2 pages.
"Glossary of the Mapping Sciences," American Society of Civil Engineering, ASCE Publications, 1994, pp. 9-10, 3 pages.
"Microsoft's MSN Virtual Earth: The Map is the Search Platform," Directions Magazine URL=http://www.directionsmag.com/article.php?article_id=873&trv=1, retrieved Feb. 6, 2009, 10 pages.
"Photo Tours Google," Web Search, retrieved Oct. 25, 2013, from http://www.google.com/search?q=photo+tours=google, 2 pages.
"Pictometry—In the News," URL=http://204.8.121.114/pressrelease%20archived/pressrelease_aec.asp, retrieved Feb. 6, 2009, 3 pages.
"Software; New Products," LexisNexis Roofing Contractor article 23(2):121(2), Jan. 3, 2006, 1 page.
"Sorcerer: Nobody builds roofs like this builds roofs," retrieved from URL=http://web.archive.org/web/2006021409237/http://www.applicad.com.au/product-features . . . on Mar. 29, 2012, 2 pages.
Aerodach, "Protokoll zur Dachauswertung," Oct. 19, 2010, 12 pages.
Aerowest GMBH, "AeroDach—das patentierte Dachaufmass," Jan. 1, 2006, retrieved from URL=http://web.archive.org/web/20060101021543/http://www.aerowest.de/aerodach.html on Mar. 25, 2012, 2 pages.
Aerowest GMBH, "Aerowest Pricelist of Geodata," Oct. 21, 2005, 2 pages.
Aerowest GMBH, "Geodata Service; AeroDach—Patented Roof Dimensions," Jan. 1, 2006, retrieved from URL=http://web.archive.org/web/20060101021543/http://www.aerowest.de/aerodach.html, on Mar. 25, 2012, 2 pages.
Aerowest GMBH. "Preisliste Geodaten Aerowest," Oct. 21, 2005, 1 page.

Agarwal et al., "Reconstructing Rome," *IEEE Computer* 43(6): 40-47, Jun. 2010.
Agarwal et al., "Building Rome in a Day," *Communications of the ACM* 54(10): 105-112, Oct. 2011.
Agarwala et al., "Interactive Digital Photomontage," ACM SIGGRAPH 2004, Los Angeles, CA, Aug. 2004, 9 pages.
Agarwala et al., "Panoramic Video Textures," SIGGRAPH 2005, Los Angeles, CA, Aug. 2005, 8 pages.
Appli-cad Australia, "Linear Nesting Reports," AppliCad Sample Reports, Jul. 18, 2000, 9 pages.
Appli-cad Australia, "Roof Magician: Especially suited to single, shake and tile roofing," Sample Reports, Jun. 24, 2004, 13 pages.
Appli-cad Australia, "Roof Wizard: Advanced Software for Roof Modeling and Estimating," Document Issue 1.0.0, Sep. 25, 2004, 10 pages.
Appli-cad Australia, "Roof Wizard: Especially suited to metal roofing," Generate Offcuts Reports, Mar. 9, 2005, 7 pages.
Appli-cad Australia, "Roof Wizard: Especially suited to metal roofing," Generate Offcuts Reports, Sep. 14, 2006, 7 pages.
Appli-cad Australia, "Roof Wizard: Especially suited to metal roofing," Sample Reports, Jul. 13, 2004, 24 pages.
Appli-cad Australia, "Roof Wizard: Especially suited to metal roofing," Sample Reports, Sep. 17, 2002, 12 pages.
Appli-cad Australia, "Sorcerer: Advanced Software for Roof Modeling and Estimating," Reference Guide Version 3, Sep. 8, 1999, 142 pages.
Appli-cad Australia, "Sorcerer: The complete solution for professional roof estimating," Demonstration Kit, Mar. 9, 2005, 15 pages.
AppliCad Roofing, sample report dated Jul. 30, 2007, 1 page.
Applicad Roofing, sample report dated Mar. 2, 2005, 28 pages.
AppliCad USA, "Linear Nesting Reports," AppliCad Sample Reports, Nov. 25, 1999, 9 pages.
Applicad webpage 2005 snip different color lines, 1 page.
AppliCad, "Example Output and Brochures," retrieved from URL=http://www.applicad.com/au/product-reports.html on Apr. 16, 2012, 2 pages.
AppliCad, "Product Overview—Sorcerer: Advanced Software for Roofing Modeling, Estimating, Presentation and Installation," Issue 5, Mar. 2, 2001, 15 pages.
AppliCad, "Roofing Software: Product Bulletin Section 1—Modeling the Roof," Dec. 20, 2005, retrieved from URL=htpp://web.archive.org/web/20021122204408/http://www.applicad.com.au/ on Apr. 16, 2012, 3 pages.
AppliCad, "Roofing Software: Product Bulletin Section 1—Modeling the Roof," Jan. 7, 2002, retrieved from URL=htpp://web.archive.org/web/20021122204408/http://www.applicad.com.au/ on Apr. 16, 2012, 3 pages.
AppliCad, "Roofing Software: Product Bulletin Section 2—Modifying the Model," Dec. 20, 2005, retrieved from URL=http://web.archive.org/web/20051210130430/http://www.applicad.com.au/ on Apr. 16, 2012, 2 pages.
AppliCad, "RoofScape: Advanced Software for Roof Modeling and Estimating," Learning Guide (English Units), Revision 1.1, Aug. 2007, 48 pages.
Atkinson, "Therory of Close Range Photogrammetry," Chapter 2, Section 1, Coordinate Transformations, retrieved Oct. 21, 2013, from http://www.lems.brown.edu/vision/people/leymarie/Refs/Photogrammetry/Atkinson90/C . . . , 5 pages.
Australian Office Action for Australian Application No. 2010201839, dated Apr. 14, 2011, 2 pages.
Australian Office Action, dated Oct. 1, 2013, for Australian Application No. 2010219392, 4 pages.
Autodesk, "Autodesk ImageModeler—Features," retrieved on Sep. 30, 2008, from http:///usa.autodesk.com/adsk/servlet/index?siteID=123112&id=115639 . . . , 1 page.
Automatic House Reconstruction, retrieved on Sep. 29, 2008, from http://www.vision.ee.ethz.ch/projects/Amobe_I/recons.html, 7 pages.
Azuma et al., "View-dependent refinement of multiresolution meshes with subdivision connectivity," *Proceedings of the Second International Conference on Computer Graphics, Virtual Reality, Visualization, and Interaction (Afigraph 2003)*, Capetown, South Africa, Feb. 2003, pp. 69-78.

(56) References Cited

OTHER PUBLICATIONS

Baillard et al., :Automatic reconstruction of piecewise planar models from multiple views, CVPR99, vol. 2, 1999, pp. 559-565, 7 pages.
Bazaraa et al., *Nonlinear Programming Theory and Algorithms*, Second Edition, John Wiley & Sons, Inc., New York, 1993, 330 pages.
Bhat et al., "A Perceptually-Motivated Optimization-Framework for Image and Video Processing," Computer Science & Engineering Technical Report, UW-CSE-08-06-02, University of Washington, Seattle, WA, Jun. 2008, 10 pages.
Bhat et al, "Fourier Analysis of the 2D Screened Poisson Equation for Gradient Domain Problems," ECCV 2008, 14 pages.
Bhat et al., "GradientShop: A Gradient-Domain Optimization Framework for Image and Video Filtering," ACM TOG 29(2), Mar. 2010, 14 pages.
Bhat et al., "Piecewise Image Registration in the Presence of Large Motions," CVPR 2006, New York, NY, Jun. 2006, 7 pages.
Bhat et al., "Using Photographs to Enhance Videos of a Static Scene," Eurographics Symposium on Rendering 2007, 12 pages.
Bignone et al., "Automatic Extraction of Generic House Roofs from High Resolution Aerial Imagery," *Proc. ECCV*, 1996, 12 pages.
Canadian Office Action, for Canadian Application No. 2,641,373, dated Jan. 9, 2012, 4 pages.
Canadian Office Action, dated Sep. 24, 2013, for Canadian Application No. 2,641,373, 4 pages.
Capell et al., "A Multiresolution Framework for Dynamic Deformations," Computer Science & Engineering Technical Report, UW-CSE-02-04-02, University of Washington, Seattle, WA, Apr. 2002, 8 pages.
Chevrier et al., "Interactive 3D reconstruction for urban areas—An image based tool," *CAAD Futures*, 2001, 13 pages.
Chuang et al., "A Bayesian Approach to Digital Matting," IEEE Computer Vision and Pattern Recognition 2001, Kauai, Hawaii, Dec. 2001, 8 pages.
Chuang et al., "Animating Pictures with Stochastic Motion Textures," SIGGRAPH 2005, Los Angeles, CA, Aug. 2005, 8 pages.
Chuang et al., "Animating Pictures with Stochastic Motion Textures," Technical Report UW-CSE-04-04-02, SIGGRAPH 2005, Los Angeles, CA, Aug. 2005, 7 pages.
Chuang et al., "Environment Matting Extensions: Towards Higher Accuracy and Real-Time Capture," SIGGRAPH 2000, New Orleans, LA, Jul. 24-28, 2000, 11 pages.
Chuang et al., "Environment Matting Extensions: Towards Higher Accuracy and Real-Time Capture," Tech Report, SIGGRAPH 2000, New Orleans, LA, Jul. 24-28, 2000, 10 pages.
Chuang et al., "Shadow Matting and Compositing," SIGGRAPH 2003, San Diego, CA, Jul. 2003, 7 pages.
Ciarcia et al., "Automated Roof Identification Systems and Methods," U.S. Appl. No. 12/590,131, filed Nov. 2, 2009, 74 pages.
Ciarcia et al., "Automated Roof Identification Systems and Methods," U.S. Appl. No. 12/590,131, Notice of Allowance, dated Aug. 26, 2013, 9 pages.
Ciarcia et al., "Automated Roof Identification Systems and Methods," Office Action dated Jan. 9, 2013, for U.S. Appl. No. 12/590,131, 14 pages.
Ciarcia, "Systems and Methods for Point-to-Point Registration Using Perspective Imagery From Independent Sources Without Image Acquisition Metadata," U.S. Appl. No. 13/646,466, filed Oct. 5, 2012, 41 pages.
Colburn et al., "Image-Based Remodeling," IEEE Transactions on Visualization and Computer Graphics, vol. 19, No. 1, Jan. 2013, 11 pages.
Curless et al., "Better Optical Triangulation Through Spacetime Analysis," Computer Systems Laboratory Technical Report CSL-TR-95-667, Stanford University, Stanford, CA, Apr. 1995, 12 pages.
Curless et al., "Computer model and 3D fax of Happy Buddha," retrieved Oct. 25, 2013, from http://www-graphics.stanford.edu/projects/faxing/happy/, 4 pages.

Curless et al., "A Volumetric Method for Building Complex Models from Range Images," SIGGRAPH '96, New Orleans, LA, Aug. 4-9, 1996, 10 pages.
Curless et al., "Better Optical Triangulation through Spacetime Analysis," 1995 $5^{th}$ International Conference on Computer Vision, Boston, MA, Jun. 20-23, 1995, 8 pages.
Curless, "New Methods for Surface Reconstruction from Range Images," Dissertation, Submitted to the Department of Electrical Engineering and the Committee of Graduate Studies of Stanford University, Jun. 1997, 209 pages.
Curless, "From Range Scans to 3D Models," *ACM SIGGRAPH Computer Graphics* 33(4): 38-41, 1999.
Debevec et al., "Modeling and Rendering Architecture from Photographs: A hybrid geometry- and image-based approach," *SIGGRAPH conference proceedings*, retrieved from www.cs.berkeley.edu/~malik/papers/debevecTM96.pdf., 1996, 10 pages.
Delaney, "Searching for Clients From Above—More Small Businesspeople Use Aerial Mapping Services to Scout Potential Customers," *The Wall Street Journal*, Jul. 31, 2007, retrieved on Feb. 25, 2010, from http://online.wsj.com/public/article/SB118584306224482891.html?mod=yahoo_free, 3 pages.
Drawing received Jan. 31, 2012.
*Eagle View Tech.* v. *Aerialogics LLC*, Case No. 2:12-cv-00618-RAJ, Prior Art Presentation, Aug. 17, 2012, 61 pages.
ECE 390, Introduction to Optimization, Spring 2004, Introductory Course, retrieved Oct. 25, 2013, from http://liberzon.csl.illinois.edu/04ECE390.html, 1 page.
Ekman, "Price Estimation Tool," Office Action for U.S. Appl. No. 13/843,437, dated Aug. 14, 2013, 9 pages.
Falkner et al., *Aerial Mapping 2nd Edition*, Lewis Publishers (CRC Press LLC), 2002, "Chapter 11—Aerotriangulation," 23 pages.
Faugeras et al., "3-D reconstruction of Urban Scenes from Sequences of Images," Institut National De Recherche En Informatique Et En Automatique, No. 2572, Jun. 1995, 27 pages.
Faugeras, "What can be seen in three dimensions with an uncalibrated stereo rig?," *Computer Vision—ECCV '92*: 563-578, 1992. (18 pages).
Fisher et al., *Dictionary of Computer Vision and Image Processing*, John Wiley & Sons, Ltd., West Sussex, England, 2005, 182 pages.
Fritsch, "Introduction into Digital Aerotriangulation," Photogrammetric Week '95, Wichman Verlag, Heidelberg, 1995, pp. 165-171, 7 pages.
Furukawa et al., "Manhattan-world Stereo," CVPR 2009, Miami, Florida, Jun. 2009, 8 pages.
Furukawa et al., "Reconstructing Building Interiors from Images," ICCV 2009, Kyoto, Japan, Sep. 2009, 8 pages.
Furukawa et al, "Towards Internet-scale Multi-view Stereo," CVPR 2010, Jun. 2010, 8 pages.
Georgeiv et al., "Spatio-Angular Resolution Tradeoff in Integral Photography," Proceedings of Eurographics Symposium on Rendering, 2006, 10 pages.
GEOSPAN Corporation, "Digital Geo-Referenced Oblique Aerial Imagery Solution EPP-REP No. 8444 5/13," GEO-NY0000868, 2007, 28 pages.
Goesele et al., "Multi-View Stereo for Community Photo Collections," Proceedings of ICCV 2007, Rio de Janeiro, Brazil, Oct. 2007, 8 pages.
Goesele et al., "Multi-View Stereo Revisited," CVPR 2006, New York, NY, Jun. 2006, 8 pages.
Goldman et al., "Interactive Video Object Annotation," Computer Science & Engineering Technical Report, UW-CSE-07-04-01, University of Washington, Seattle, WA, Apr. 2007, 7 pages.
Goldman et al., "Schematic Storyboarding for Video Editing and Visualization." SIGGRAPH 2006, Boston, MA, Aug. 2006, 10 pages.
Goldman et al., "Shape and Spatially-Varying BRDFs From Photometric Stereo," IEEE Transactions on Pattern Analysis and Machine Intelligence, vol. 32, No. 6, Jun. 2010, 12 pages.
Goldman et al., "Shape and Spatially-Varying BRDFs From Photometric Stereo," ICCV 2005, Beijing, China, Oct. 2005, 8 pages.
Goldman et al., "Video Object Annotation, Navigation, and Composition," UIST 2008, 10 pages.

(56) References Cited

OTHER PUBLICATIONS

Gonzalez et al., *Digital Image Processing*, Addison-Wesley Publishing Company, Inc., Reading, Massachusetts, 1993, 372 pages.
Gulch et al., "On the Performance of Semi-Automatic Building Extraction," in the International Archives of Photogrammetry and Remote Sensing, vol. 23, 8 pages, 1998.
Gupta et al., "Enhancing and Experiencing Spacetime Resolution with Videos and Stills," Computer Science & Engineering Technical Report, UW-CSE-04-08-01, University of Washington, Seattle, WA, Apr. 2008, 6 pages.
Gupta et al., "DuploTrack: A Real-time System for Authoring and Guiding Duplo Block Assembly," UIST 2012, Boston, MA, Oct. 2012, 13 pages.
Gupta et al., "Enhancing and Experiencing Spacetime Resolution with Video and Stills," ICCP 2009, San Francisco, CA, Apr. 2009, 9 pages.
Gupta et al., "Single Image Deblurring Using Motion Density Functions," ECCV 2010, Crete, Greece, Sep. 2010, 14 pages.
Hartley et al., "2.4 A Hierarchy of Transformations", Multiple View Geometry in Computer Vision, Cambridge University Press, Second Edition, 2003, 9 pages.
Hartley et al., "Appendix 6: Iterative Estimation Methods," Multiple View Geometry in Computer Vision, Cambridge University Press, Second Edition, 2003, 34 pages.
Hartley et al., "Invariant and Calibration-Free Methods in Scene Reconstruction and Object Recognition," Final Technical Report, Feb. 28, 1997, 266 pages.
Hartley et al., *Multiple View Geometry in Computer Vision*, Second Edition, Cambridge University Press, Cambridge, England, 2003, 672 pages.
Held et al., "3D Puppetry: A Kinect-based Interface for 3D Animation," UIST 2012, Boston, MA, Oct. 2012, 11 pages.
Henricsson et al., "3-D Building Reconstruction with ARUBA: A Qualitative and Quantitative Evaluation," Institute of Geodesy and Photogrammerty, Swiss Federal Institute of Technology, 2001, 13 pages.
Hudson, "Merging VRML Models: Extending the Use of Photomodeller," Thesis, in TCC 402, Presented to the Faculty of the School of Engineering and Applied Science, University of Virginia, Mar. 23, 1998, 23 pages.
International Preliminary Report on Patentability for International Application No. PCT/US2011/023408, dated Aug. 16, 2012, 7 pages.
International Search Report and Written Opinion for International Application No. PCT/US2013/023502, dated Apr. 30, 2013, 8 pages.
International Search Report for International Application No. PCT/US11/23408, dated Aug. 11, 2011, 2 pages.
International Search Report for International Application No. PCT/US2013/023503, dated Apr. 30, 2013, 5 pages.
International Search Report and Written Opinion for International Application No. PCT/US2013/024523, dated Nov. 13, 2013, 15 pages.
Kolman, "Chapter 4, Linear Transformations and Matrices, 4.1: Definition and Examples," Elementary Linear Algebra, Second Edition, Macmillan Publishing Co,. Inc., 1997, 12 pages.
KP Building Products, "Vinyl Siding Estimating and Installation Guide," 2007, 32 pages.
Krainin et al., "Autonomous Generation of Complete 3D Object Models Using Next Best View Manipulation Planning," ICRA 2011, Shanghai, China, May 2011, 7 pages.
Kushal et al., "Photo Tours," 3DimPVT, Oct. 2012, 8 pages.
Levoy et al., "The Digital Michelangelo Project: 3D Scanning of Large Statues," SIGGRAPH 2000, New Orleans, LA, Jul. 24-28, 2000, 14 pages.
Levoy, "The Digital Michelangelo Project," retrieved Oct. 25, 2013, from http://www-graphics.stanford.edu/projects/mich/, 10 pages.
Li et al., "Automated Generation of Interactive 3D Exploded View Diagrams," ACM Transactions on Graphics 27(3), SIGGRAPH 2007, Aug. 2007, 7 pages.
Li et al., "Interactive Cutaway Illustration of Complex 3D Models," ACM Transactions on Graphics 26(3), SIGGRAPH 2007, Aug. 2007, 11 pages.
Lueders, "Infringement Allegations by EagleView Technologies," Feb. 10, 2009, 3 pages.
Mahajan et al., "A Theory of Frequency Domain Invariants: Spherical Harmonic Identities for BRDF / Lighting Transfer and Image Consistency," IEEE Pattern Analysis and Machine Intelligence, 30(2), Feb. 2008, 14 pages.
Mahajan et al., "A Theory of Spherical Harmonic Identities for BRDF/Lighting Transfer and Image Consistency," ECCV 2006, Graz, Austria, May 2006, 14 pages.
Mann, "Roof with a view," *Contract Journal* 431(6552):29, Nov. 23, 2005, 2 pages.
Mikhail et al., *Introduction to Modern Photogrammetry*, John Wiley & Sons, Inc., New York, 2001, 247 pages.
Miller et al., "Miller's Guide to Framing and Roofing," McGraw Hill, New York, pp. 131-136 and 162-163, 2005, 9 pages.
Minialoff, "Introduction to Computer Aided Design," Apr. 2000, 4 pages.
Noronha et al., "Detection and Modeling of Buildings from Multiple Aerial Images," Institute for Robotics and Intelligent Systems, University of Southern California, Nov. 27, 2001, 32 pages.
Noronha et al., "Detection and Modeling of Buildings from Multiple Aerial Images," *IEEE Transactions on Pattern Analysis and Machine Intelligence* 23(5):501-518, 2001, 32 pages.
Office Action received in Reexamination of U.S. Pat. No. 8,078,436 B2, Supplemental Reexamination Patent, dated Jul. 25, 2013, 72 pages.
Office Action received in Reexamination of U.S. Pat. No. 8,145,578 B2, Supplemental Reexamination Patent, dated Jul. 25, 2013, 24 pages.
Pershing et al., "Aerial Roof Estimation System and Method," Amendment in Response to Office Action received in Reexamination of U.S. Pat. No. 8,145,578 B2, Control No. 96/000,005, filed Oct. 25, 2013, 318 pages.
Pershing et al., "Aerial Roof Estimation System and Method," Amendment in Response to Office Action received in Reexamination of U.S. Pat. No. 8,078,436 B2, Control No. 96/000,004, filed Oct. 25, 2013, 229 pages.
Pershing et al., "Aerial Roof Estimation System and Method," Notice of Allowance dated Feb. 3, 2012, for U.S. Appl. No. 12/148,439, 35 pages.
Pershing et al., "Aerial Roof Estimation System and Method," Office Action dated Apr. 25, 2011, for U.S. Appl. No. 12/148,439, 52 pages.
Pershing et al., "Aerial Roof Estimation System and Method," Office Action dated Aug. 16, 2010, for U.S. Appl. No. 12/148,439, 47 pages.
Pershing et al., "Aerial Roof Estimation System and Method," Office Action dated Aug. 25, 2011, for U.S. Appl. No. 12/148,439, 77 pages.
Pershing et al., "Aerial Roof Estimation System and Method," Office Action dated Oct. 10, 2012, for U.S. Appl. No. 13/371,271, 7 pages.
Pershing et al., "Aerial Roof Estimation System and Method," Notice of Allowance dated Jul. 29, 2013, for U.S. Appl. No. 13/371,271, 15 pages.
Pershing et al., "Aerial Roof Estimation System and Method," U.S. Appl. No. 60/925,072, filed Apr. 17, 2007, 16 pages.
Pershing et al., "Aerial Roof Estimation System and Methods," Office Action dated Aug. 28, 2012, for U.S. Appl. No. 13/287,954, 12 pages.
Pershing et al., "Aerial Roof Estimation System and Methods," Office Action dated May 22, 2013, for U.S. Appl. No. 13/287,954, 25 pages.
Pershing et al., "Aerial Roof Estimation Systems and Methods," Notice of Allowance dated Oct. 14, 2011, for U.S. Appl. No. 12/253,092, 30 pages.
Pershing et al., "Aerial Roof Estimation Systems and Methods," Office Action dated May 10, 2011, for U.S. Appl. No. 12/253,092, 26 pages.

(56) References Cited

OTHER PUBLICATIONS

Pershing et al., "Automated Techniques for Roof Estimation," U.S. Appl. No. 61/197,072, filed Oct. 31, 2008, 32 pages.
Pershing et al., "Geometric Correction of Rough Wireframe Models Derived From Photographs," U.S. Appl. No. 61/300,414, filed Feb. 1, 2010, 22 pages.
Pershing, "Concurrent Display Systems anf Methods for Aerial Roof Estimation," Notice of Allowance dated Feb. 16, 2012, for U.S. Appl. No. 12/467,250, 19 pages.
Pershing, "Concurrent Display Systems anf Methods for Aerial Roof Estimation," Office Action dated Sep. 7, 2011, for U.S. Appl. No. 12/467,250, 14 pages.
Pershing, "Concurrent Display Systems and Methods for Aerial Roof Estimation," Office Action dated Aug. 28, 2012, for U.S. Appl. No. 13/474,504, 8 pages.
Pershing, "Concurrent Display Systems and Methods for Aerial Roof Estimation," Office Action dated Jun. 19, 2013, for U.S. Appl. No. 13/474,504, 14 pages.
Pershing, "Pitch Determination Systems and Methods for Aerial Roof Estimation," Notice of Allowance dated Feb. 16, 2012, for U.S. Appl. No. 12/467,244, 20 pages.
Pershing, "Pitch Determination Systems and Methods for Aerial Roof Estimation," Office Action for U.S. Appl. No. 13/438,288, dated Aug. 24, 2012, 8 pages.
Pershing, "Pitch Determination Systems and Methods for Aerial Roof Estimation," Office Action dated May 21, 2013, for U.S. Appl. No. 13/438,288, 11 pages.
Pershing, "Pitch Determination Systems and Methods for Aerial Roof Estimation," Office Action dated Aug. 26, 2011, for U.S. Appl. No. 12/467,244, 17 pages.
Pershing, "Systems and Methods for Estimation of Building Floor Area," U.S. Appl. No. 13/385,607, filed Feb. 3, 2012, 41 pages.
Pershing, "Systems and Methods for Estimation of Building Floor Area," U.S. Appl. No. 13/757,712, filed Feb. 1, 2013, 95 pages.
Pershing, "Systems and Methods for Estimation of Building Wall Area," U.S. Appl. No. 13/757,694, filed Feb. 1, 2013, 96 pages.
Pershing, "User Interface Techniques for Roof Estimation," U.S. Appl. No. 61/197,904, filed Oct. 31, 2008, 62 pages.
Pershing et al., Aerial Roof Estimation System and Method, Notice of Allowance, for U.S. Appl. No. 13/371,271, dated Jul. 29, 2013, 15 pages.
Pershing et al., "Automated Roof Identification Systems and Methods," Notice of Allowance for U.S. Appl. No. 12/590,131, dated Aug. 26, 2013, 9 pages.
Pershing, "Systems and Methods for Estimation of Building Floor Area," Office Action for U.S. Appl. No. 13/757,712, dated Jul. 18, 2013, 18 pages.
Pershing, "Systems and Methods for Estimation of Building Wall Area," Office Action for U.S. Appl. No. 13/757,694, dated Oct. 8, 2013, 15 pages.
Pershing, "Systems and Methods for Estimation of Building Floor Area," Notice of Allowance for U.S. Appl. No. 13/757,712, dated Nov. 25, 2013, 15 pages.
PhotoModeler, "Measuring & Modeling the Real World," retrieved Sep. 30, 2008, from http://www.photomodeler.com/products/photomodeler.htm, 2 pages.
Pictometry Online, "Government" Oct. 7, 2008, retrieved Aug. 10, 2011, from http://web.archive.org/web/20081007111115/http://www.pictometry.com/government/prod . . . , 3 pages.
Pictometry, "Electronics Field Study™ Getting Started Guide," Version 2.7, Jul. 2007, 15 pages.
Pictometry, "FAQs," Sep. 22, 2008, retrieved on Aug. 10, 2011, from http://www.web.archive.org/web/20080922013233/http://www.pictometry.com/about_us/faqs.sht . . . , 3 pages.
Pictometry.com, "Frequently Asked Questions," May 24, 2005, retrieved Mar. 28, 2012, from URL=http://web.archive.org/web/20050524205653/http://pictometry.com/faq.asp, 9 pages.
Pictometry.com, "Frequently Asked Questions," retrieved on Apr. 9, 2011, from http://replay.waybackmachine.org/20050801231818/http://www.pictometry.com/faq.asp, 10 pages.

Pictometry.com, "Frequently Asked Questions," retrieved on Aug. 1, 2005, from http://replay.waybackmachine.org/20050801231818/http:///www.pictometry.com/faq.asp, 10 pages.
Pictometry.com, "Frequently Asked Questions," retrieved on Feb. 10, 2012, from http://replay.waybackmachine.org/20050801231818/http:///www.pictometry.com/faq. asp, 6 pages.
Pictometry, "Frequently Asked Questions," Dec. 2006, retrieved Apr. 9, 2011, from http://replay.waybackmachine.org/20050801231818/http://www.pictometry.com/faq.asp, 10 pages.
Pictometry.com, "Pictometry Announces Software and Web-based Solution for Engineers, Architects, and Planners," Press Release, Jan. 22, 2004, 3 pages.
Poullis et al., "Photogrammetric Modeling and Image-Based Rendering for Rapid Virtual Environment Creation," http://handle.dtic.mil/100.2/ADA433420, 1998, 7 pages.
Precigeo.com, "Welcome to precigeoRoof," URL=http://web.archive.org/web/20070106063144/roof.precigeo.com, retrieved Apr. 30, 2009, 1 page.
Precigeo.com, "Welcome to precigeo™," "Welcome to precigeoRoof," "Why precigeoRoof," "How precigeoRoof Works," "How precigeoRoof Can Help Me," all retrieved on Feb. 26, 2010, from http://web.archive.org/, pp. 1-5; "Why precigeoRisk Works" and :Welcome to precigeoRisk, retrieved on Aug. 14, 2010, from http://web.archive.org, pp. 6-11, 11 pages total.
Precigeo.com, "Welcome to precigeo™," URL=http://web.archive.org/20080110074814/http://www.precigeo.com, retrieved Feb. 17, 2009, 1 page.
Precigo.com, "How precigeoRoof Works," URL=http://web.archive.org/web/20070107012311/roofprecigeo.com/how-precigeo-roof-works.htm, retrieved Apr. 30, 2009, 2 pages.
Reddy et al., "Frequency-Space Decomposition and Acquisition of Light Transport under Spatially Varying Illumination," ECCV 2012, Florence, Italy, Oct. 2012, 15 pages.
RoofCAD, "Satellite Takeoff Tutorial-Pitched Roof," received Jan. 31, 2012, 25 pages.
Scholze et al., "A Probabilistic Approach to building Roof Reconstruction Using Semantic Labeling," *Pattern Recognition* 2449/2002, Springer Berlin/Heidelberg, 2002, 8 pages.
Schutzberg et al., "Microsoft's MSN Virtual Earth: The Map is the Search Platform," *Directions Magazine*, retrieved Feb. 6, 2009, from http://www.directionsmag.com/article.php?article_id=873&try=1, 10 pages.
Seitz et al., "A Comparison and Evaluation of Multi-view Stereo Reconstruction Algorithms," CVPR 2006, New York, NY, Jun. 2006, 8 pages.
Sengül, "Extracting Semantic Building Models From Aerial Stereo Images and Convesion to Citygml," Thesis, Istanbul Technical University Institute of Science and Technology, May 2010, 138 pages.
Shan et al., "Refractive Height Fields from Single and Multiple Images," CVPR 2012, Providence, RI, Jun. 2012, 8 pages.
Shan et al., "Refractive Height Fields from Single and Multiple Images," CVPR 2012, Providence, RI, Jun. 2012, poster, 1 page.
Sorcerer software screenshot, modified on Sep. 6, 2012, 1 page.
Steuer, "Heigh Snakes: 3D Building Reconstruction from Aerial Image and Laser Scanner Data," Joint Urban Remote Sensing Event (JURSE 2011), Munich, Germany, Apr. 11-13, 2011, pp. 113-116.
University of Washington, College of Arts & Sciences, Mathematics, Course Offerings, Autumn Quarter 2013 and Winter Quarter 2014, retrieved Oct. 25, 2013, from http://www.washington.edu/students/crscat/math.html, 16 pages.
U.S. Appl. No. 60/425,275, filed Nov. 8, 2002, 32 pages.
Wattenberg et al., "Area, Volume, and Torque in Three Dimensions," retrieved on Sep. 24, 2013, from http://www.math.montana.edu/frankw/ccp/multiworld/twothree/atv/learn.htm, 14 pages.
Weeks et al., "A Real-Time, Multichannel System with Parallel Digital Signal Processors," *Proceedings of IEEE International Conference on Acoustics, Speech and Signal Processing (ICASSP 1990)* 3: 1787-1790, Apr. 1990.
Wolf, *Elements of Photogrammetry*, McGraw-Hill Kogakusha, 1974, "Chapter Fourteen: Aerotriangulation; 41-1 Introduction," pp. 351-352, 3 pages.

(56) References Cited

OTHER PUBLICATIONS

Wood et al., "Surface Light Fields for 3D Photography," SIGGRAPH 2000, New Orleans, LA, Jul. 24-28, 2000, 10 pages.
Written Opinion for International Application No. PCT/US11/23408, dated Aug. 11, 2011, 5 pages.
Written Opinion for International Application No. PCT/US2013/023503, dated Apr. 30, 2013, 4 pages.
Written Opinion for International Application No. PCT/US2013/023502, dated Apr. 30, 2013, 3 pages.
Wu et al., "Multicore Bundle Adjustment," CVPR 2011, Colorado Springs, CO, Jun. 2011, 8 pages.
Wu et al., "Schematic Surface Reconstruction," CVPR 2012, Providence, RI, Jun. 2012, 1 page.
www.archive.org Web site showing alleged archive of PhotoModeler Web Site http://www.photomodeler.com/pmpro08.html from Feb. 9, 2006 (retrieved Oct. 21, 2013), 4 pages.
www.archive.org Web site showing alleged archive of German Aerowest Web Site http://aerowest.de/ from Feb. 6, 2006 (retrieved Sep. 20, 2012) and translated to English, 61 pages.
www.archive.org Web site showing alleged archive of German AeroDach Web Site http://www.areodach.de from Jun. 13, 2004 (retrieved Sep. 20, 2012) and translations to English, 21 pages.
YouTube, "Pictometry Online Demo," retrieved on Feb. 6, 2006, from http://www.youtube.com/watch?v=jURSKo0OD0, 1 page.
YouTube, "Pictometry Online Webinar for MAIA Members," uploaded Apr. 8, 2011, retrieved from http://www.youtube.com/watch?v=RzAXK2avqQQ, 2 pages.
Zhang et al., "Rapid Shape Acquisition Programming," International Symposium Using Color Structured Light and Multi-Pass Dynamic on 3D Data Processing Visualization and Transmission, Padova, Italy, Jun. 2002, 13 pages.
Zhang et al., "Shape and Motion Under Varying Illumination: Unifying Structure from Motion, Photometric Stereo, and Multi-view Stereo," ICCV 2003, Nice, France, Oct. 2003, 8 pages.
Zhang et al., "Spacetime Stereo: Shape Recovery for Dynamic Scenes," CVPR 2003, Madison, Wisconsin, Jun. 2003, 8 pages.
Zheng et al., "A Consistent Segmentation Approach to Image-based Rendering," Technical Report CSE-09-03-02, 2002, 8 pages.
Zheng et al., "Parallax Photography: Creating 3D Cinematic Effects form Stills," Proceedings of Graphics Interface 2009, Kelowna, BC, CA, May 2009, 8 pages.
Ziegler et al., "3D Reconstruction Using Labeled Image Regions," Mitsubishi Research Laboratories, http://www.merl.com, Jun. 2003, 14 pages.
Zongker et al., "Environment Matting and Compositing," SIGGRAPH '99, Los Angeles, CA, Aug. 9-13, 1999, 10 pages.
Pershing et al., "Aerial Roof Estimation System and Method," Amendment for U.S. Appl. No. 13/371,271, filed Mar. 11, 2013, 31 pages.
Autodesk, Inc., "AutoCAD 2011: User's Guide," Feb. 2010, retrieved from http://docs.autodesk.com/ACD/2011/ENU/pdfs/acad_aug.pdf, on Dec. 15, 2014, 2280 pages.
Australian Examination Report, dated Dec. 18, 2014, for corresponding Australian Patent Application No. 2013205518, 8 pages.
John Doe Roofing, "Premium Roof and Walls Report," Oct. 8, 2012, Eagle View Technologies, Inc., Report 1234567, retrieved from http://web.archive.org/web/20121116170417/http://www.eagleview.com/portals/0/portalcontent/SR-2400%20Prem&Wall.pdf, on Dec. 15, 2014, 18 pages.
Lam et al., "Task 2.2 12—CMU Report 02: Identification and Analysis of Interoperability Gaps between Nbims/Open Standards and Building Performance Simulation Tools," Feb. 2012, Carnegie Mellon University, Greater Philadelphia Innovation Cluster for Energy—Efficient Buildings, retrieved from http://www.andrew.cmu.edu/user/okaraguz/TechnicalWritingSamples/Interoperability_Identification.pdf, on Dec. 15, 2014, 25 pages.
International Search Report and Written Opinion of the International Searching Authority, dated Jul. 8, 2014, for International Application No. PCT/US14/25030, 11 pages.
USPTO, Office Action regarding U.S. Appl.No. 13/385,607, dated May 5, 2017.
Eagle View Technologies, Inc., Response to Office Action regarding U.S. Appl. No. 13/385,607, dated May 3, 2016.
Eagle View Technologies, Inc., Response to Office Action regarding U.S. Appl. No. 13/844,684, dated Jan. 27, 2017.
USPTO, Office Action regarding U.S. Appl. No. 13/844,684, dated Sep. 18, 2017.
USPTO, Office Action regarding U.S. Appl. No. 13/844,467, dated Aug. 17, 2017.
Eagle View Technologies, Inc., Response to Dec. 20, 2016 Office Action regarding U.S. Appl. No. 14/204,142, dated Jun. 20, 2017.
Eagle View Technologies, Inc., Response to Australian Patent Office Examination Report regarding Australian Patent Application No. 2016228305, filed Aug. 31, 2017.
Eagle View Technologies, Inc., Response to Office Action regarding U.S. Appl. No. 13/844,467, dated Jul. 14, 2017.
Eagle View Technologies, Inc., Response to Office Action regarding U.S. Appl. No. 13/844,684, dated Jun. 8, 2017.
USPTO, Office Action regarding U.S. Appl. No. 13/844,684, dated Feb. 8, 2017.
USPTO, Office Action regarding U.S. Appl. No. 14/204,142, dated Dec. 20, 2016.
USPTO, Office Action regarding U.S. Appl. No. 13/844,684, dated Jul. 28, 2016.
Eagle View Technologies, Inc., Response to Office Action regarding U.S. Appl. No. 13/385,607, dated Nov. 6, 2017.
Amendment, filed Apr. 29, 2016, U.S. Appl. No. 13/844,684, Pershing et al., "Systems and Methods for Estimation of Building Wall Area and Producing a Wall Estimation Report," 7 pages.
Amendment, filed Oct. 28, 2016, U.S. Appl. No. 13/844,684, Pershing et al., "Systems and Methods for Estimation of Building Wall Area and Producing a Wall Estimation Report," 15 pages.
Charaniya, "3D Urban Reconstruction from Aerial LiDAR data," Computer Science, University of California, Santa Cruz, pp. 1-43, IEEE, 2004.
Investopedia.com, "Floor Area Ratio—FAR," Mar. 28, 2010, 2 pages.
Notice of Allowance, dated Oct. 13, 2016, U.S. Appl. No. 13/757,694, Pershing, "Systems and Methods for Estimation of Building Wall Area," 12 pages.
Office Action, dated Dec. 1, 2015, U.S. Appl. No. 13/844,684, Pershing et al., "Systems and Methods for Estimation of Building Wall Area and Producing a Wall Estimation Report," 19 pages.
Office Action, dated Jul. 28, 2016, U.S. Appl. No. 13/844,684, Pershing et al., "Systems and Methods for Estimation of Building Wall Area and Producing a Wall Estimation Report," 25 pages.
Office Action, dated Sep. 16, 2016, U.S. Appl. No. 13/844,467, Pershing, "Systems and Methods for Performing a Risk Management Assessment of a Property," 44 pages.
Office Action, dated Nov. 17, 2015, U.S. Appl. No. 13/385,607, Pershing, "Systems and Methods for Estimation of Building Floor Area," 17 pages.
Office Action, dated Nov. 9, 2015, U.S. Appl. No. 13/757,694, Pershing, "Systems and Methods for Estimation of Building Wall Area," 14 pages.
Patent Examination Report No. 3, dated Sep. 13, 2016, for Australian Application No. 2013205518, 3 pages.
YouTube Video, "Drawing 3D Roofs with AutoCAD Architecture," uploaded on Dec. 14, 2010, provided on CD-ROM, downloaded from https://www.youtube.com/watch?v=0huJUPfK4w0 on Dec. 8, 2016.

\* cited by examiner

SYSTEMS AND METHODS FOR ESTIMATION OF BUILDING WALL AREA

BACKGROUND

Technical Field

This invention is in the field of building size estimation, and in particular, building wall area estimation.

Description of the Related Art

The square footage measurements of a building walls are used as a main factor in quickly estimating costs of materials and labor to repair or replace walls (or wall coverings, such as siding, paint, and various facade materials) of the building and make other improvements or modifications to the entire building (e.g., to estimate the cost of siding materials to re-side a house). Thus, accurate wall area measurements are instrumental in these calculations. Current methods of measuring wall area often involve a person having to visit the building and manually measure particular dimensions of the building, or by referring to original plans or blueprints of the building. Manually measuring the dimensions for calculation of building wall area is costly and original plans for the building may be unavailable or out of date. Therefore, accurate methods for estimating and verifying wall area that avoid these drawbacks are desirable.

SUMMARY OF THE INVENTION

In one embodiment, a wall area estimation system generates an estimated wall area measurement of a building based on the received roof measurements (e.g., those generated by or found in a three dimensional model of the roof) and a reference distance. This reference distance is a measurement indicative of a distance between a reference point on the roof and the ground surface. This reference distance may be used to determine how for down to extend the walls of the building (e.g., to a ground level) when building a digital three dimensional model of the building to aid in generating wall area measurements.

The wall area measurement estimation system may be a system integrated with a roof estimation system or other system that provides roof measurements. In other embodiments, the roof area measurements may be provided by an external source, system or entity, or may be input manually by an operator of the wall area measurement estimation system.

The resulting wall measurements, roof measurements, measurements of areas missing from the wall, etc., generated by the wall estimation system may be used to generate a wall estimate report, or a combined roof and wall estimate report. The estimate report may include various different identifiers indicating different features and measurements displayed on images and/or line drawings of the building and/or in different areas of the report based on the generated three dimensional model of the building.

DETAILED DESCRIPTION

Figure 1A:
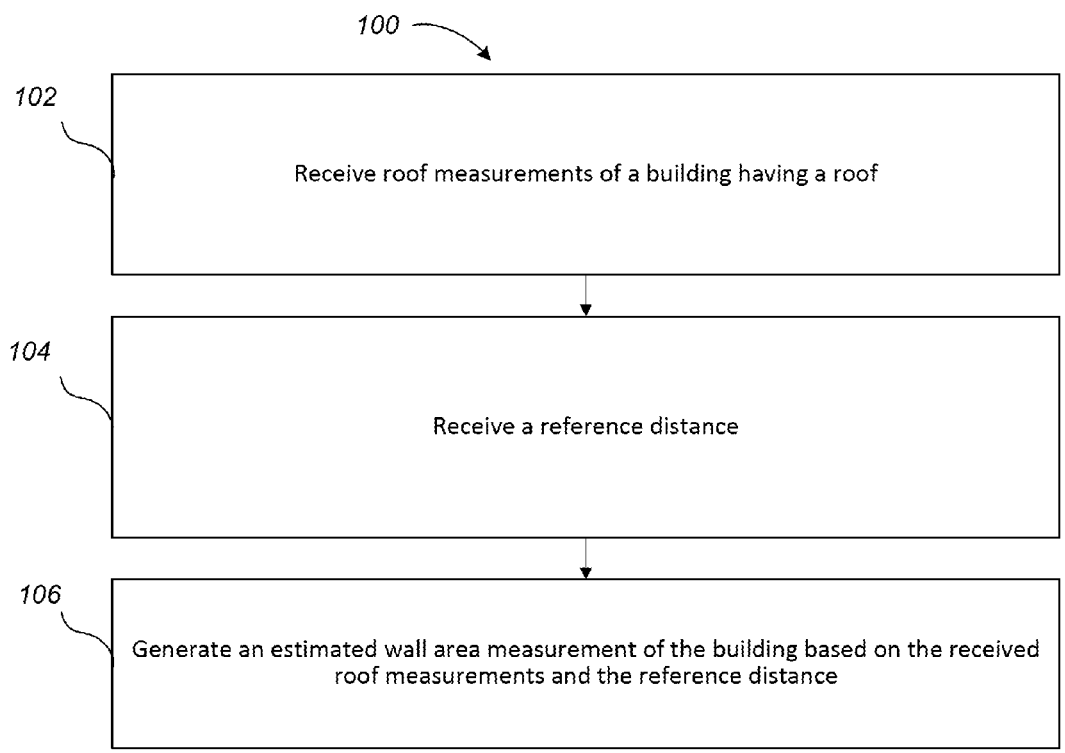
FIG. 1A is a flow diagram showing an example method of generating an estimated wall area measurement, according to one non-limiting illustrated embodiment.

FIG. 1A is a flow diagram showing an example method 100 of generating an estimated wall area measurement, according to one non-limiting illustrated embodiment.

While each of the steps shown in FIG. 1A contributes to the overall solution, each can be used independently or in various combinations to yield improvements in estimating wall area measurements as discussed below. Below is an overview of each step in the process, which will be followed by a more detailed discussion of each step.

At 102, the process receives roof measurements of a building having a roof. These measurements may be estimated or actual dimensional and/or area measurements of the roof such as one or more of: roof edge lengths, ridge lengths, gable lengths, hip lengths, valley lengths, roof section pitch, roof area measurements, planar roof section area measurements, planar roof section dimension measurements, etc. These roof measurements may be generated internally by a component of a system that estimates wall area measurements (i.e., a wall area measurement estimation system) and received from such an internal component, or may be generated and received from an external component or entity separate from the wall area measurement estimation system. In some embodiments, the external component is located remotely from the wall area measurement estimation system.

For example, in some embodiments, the wall area measurement estimation system may be a system integrated with a roof estimation system or other system that provides roof measurements. In other embodiments, the roof area measurements may be provided by an external source, system or entity, or may be input manually by an operator of the wall area measurement estimation system.

At 104, the process receives a reference distance. This reference distance is a measurement indicative of a distance between a reference point on the roof and a ground surface. This reference distance may be used to determine how for down to extend the walls of the building (e.g., to a ground level) when building a three dimensional model of the building to aid in generating wall area measurements.

In particular, at 106 the process generates an estimated wall area measurement of the building based on the received roof measurements and the reference distance. The roof measurements may be generated by the roof estimation system described in one or more of U.S. patent application Ser. No. 12/148,439 filed on Apr. 17, 2008 and entitled AERIAL ROOF ESTIMATION SYSTEM AND METHOD, U.S. Pat. No. 8,078,436 issued Dec. 13, 2011, and entitled AERIAL ROOF ESTIMATION SYSTEMS AND METHODS, U.S. patent application Ser. No. 12/467,244 filed May 15, 2009 and entitled PITCH DETERMINATION SYSTEMS AND METHODS FOR AERIAL ROOF ESTIMATION, U.S. patent application Ser. No. 12/467,250 filed May 15, 2009 and entitled CONCURRENT DISPLAY SYSTEMS AND METHODS FOR AERIAL ROOF ESTIMATION, U.S. patent application Ser. No. 13/019,228 filed Feb. 1, 2011 and entitled GEOMETRIC CORRECTION OF ROUGH WIREFRAME MODELS DERIVED FROM PHOTOGRAPHS and U.S. Provisional Patent Application Ser. No. 61/594,964, filed Feb. 2, 2012 and entitled "SYSTEMS AND METHODS OF ESTIMATION OF BUILDING FLOOR AREA" which was converted to Non-provisional application Ser. No. 13/385,607, which are each incorporated herein by reference in their entireties. The roof estimation system may' be integrated with the wall area measurement estimation system, or with various components of the wall area measurement estimation system described herein.

In many such embodiments, one or more of the roof measurements are based on aerial photographs of the building via manual or automated analysis of roof features, such as by using the roof estimation system or modules described in one or more of U.S. patent application Ser. No. 12/148, 439 filed on Apr. 17, 2008 and entitled AERIAL ROOF ESTIMATION SYSTEM AND METHOD, U.S. Pat. No. 8,078,436 issued Dec. 13, 2011, and entitled AERIAL ROOF ESTIMATION SYSTEMS AND METHODS, U.S. patent application Ser. No. 12/467,244 filed May 15, 2009 and entitled PITCH DETERMINATION SYSTEMS AND METHODS FOR AERIAL ROOF ESTIMATION, U.S. patent application Ser. No. 12/467,250 filed May 15, 2009 and entitled CONCURRENT DISPLAY SYSTEMS AND METHODS FOR AERIAL ROOF ESTIMATION, U.S. patent application Ser. No. 13/019,228 filed Feb. 1, 2011 and entitled GEOMETRIC CORRECTION OF ROUGH WIREFRAME MODELS DERIVED FROM PHOTOGRAPHS, and U.S. Provisional Patent Application Ser. No. PHOTOGRAPHS, and U.S. Provisional Patent Application Ser. No. 61/594,964, filed Feb. 2, 2012 and entitled "SYSTEMS AND METHODS OF ESTIMATION OF BUILDING FLOOR AREA" which was converted to Non-provisional application Ser. No. 13/385,607. Thus, utilizing some embodiments described herein, one may estimate wall area measurements of a building merely using one or more aerial photographs of the building, with little or no additional information initially needed.

Figure 1B:
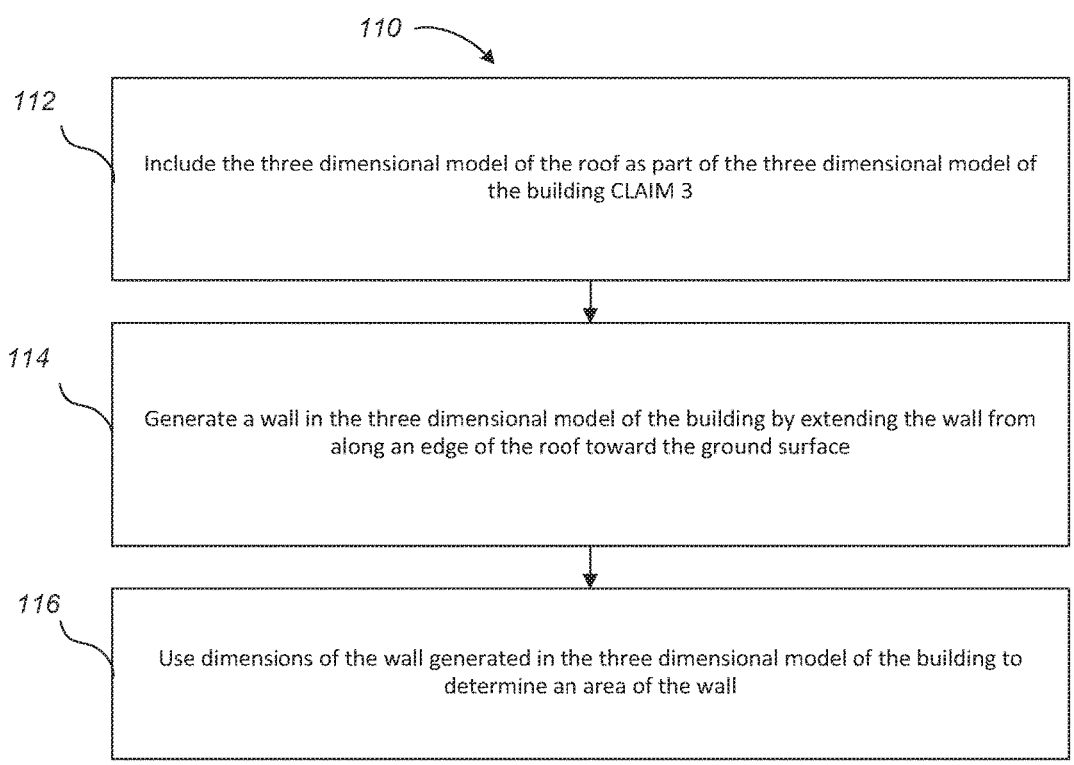
FIG. 1B is a flow diagram showing an example method that may be included as part of the generating the three dimensional model of the building step of the method shown in FIG. 1A, according to one non-limiting illustrated embodiment.

FIG. 1B is a flow diagram showing an example method 110 that may be included as part of the generating the three dimensional model of the building step of the method shown in FIG. 1A, according to one non-limiting illustrated embodiment.

While each of the steps shown in FIG. 1B contributes to the overall solution, each can be used independently or in various combinations to yield improvements in estimating wall area measurements as discussed below.

At 112, the process initially includes the three dimensional model of the roof described above as part of the three dimensional model of the building.

At 114, the process generates a wall in the three dimensional model of the building by extending the wall from along an edge of the roof toward the ground surface. As explained in more detail below, in many embodiments, in the three dimensional model the wall is dropped from some distance (see building three dimensional model 224 in FIG. 2c through FIG. 7) and set back from the edge of the roof to account for eave overhangs. In particular, the wall area estimation system extends the wall a distance until either intersecting a level of the ground surface, according to the received measurement indicative of the distance between the reference point on the roof and the ground surface, or intersecting another surface of the roof, according to the three dimensional model of the roof. In this manner, both the dimensions and shape of the wall may be built within the three dimensional model of the building. For example, this may include a triangular shape of the wall underneath a roof gable, a section of the wall between two levels of the roof, etc. This process may be repeated for each exterior wall of the building to build a three dimensional model of the building including, for example, models of the roof and exterior walls.

At 116, the process uses dimensions of the wall generated in the three dimensional model of the building to determine an area of the wall. This also may be repeated for each wall such that a total wall area for the entire building may be generated.

This three dimensional model of the building may be rendered within a graphical user interface of the wall estimation system. The graphical user interface provides selectable user interface elements within the graphical user interface configured to be placed by a user on areas of walls of the building within the three dimensional model. These graphical user interface elements represent areas missing from the wall such as doors or windows which are not to be included in the total wall area measurement. These graphical user interface elements may have dimensions corresponding to these areas missing from the wall and may also be adjustable by the user. The graphical user interface elements may also have initial dimensions corresponding to those of a predefined window size or a predefined door size (e.g., standard or typical window or door sizes). Once placed on the rendered three dimensional model, the wall area measurements will be automatically adjusted accordingly, corresponding to the area associated with each respective element placed on three dimensional model. The wall estimation system may perform this action in a variety of manners. Three different example processes to perform this automatic adjustment of the wall area measurements include, but are not limited to: (a) create a 'cut out' holes wall polygon to yield one or more new polygons that combine to form a wall with holes. Calculating the area of the new polygon(s) naturally yields a sum that is less the holes or (b) overlay objects that represent the size/position of 'holes' without making cuts into the polygon and calculate the combined area by subtracting the area of the solid wall from the area of the representative 'holes'. (c) Combination of (a) and (b)—cut the holes from the wall polygon, but then fill them in with objects representing those voids. The wall area is thus already adjusted by the cut outs without having to subtract out the areas of the objects standing in their place.

Figure 1C:
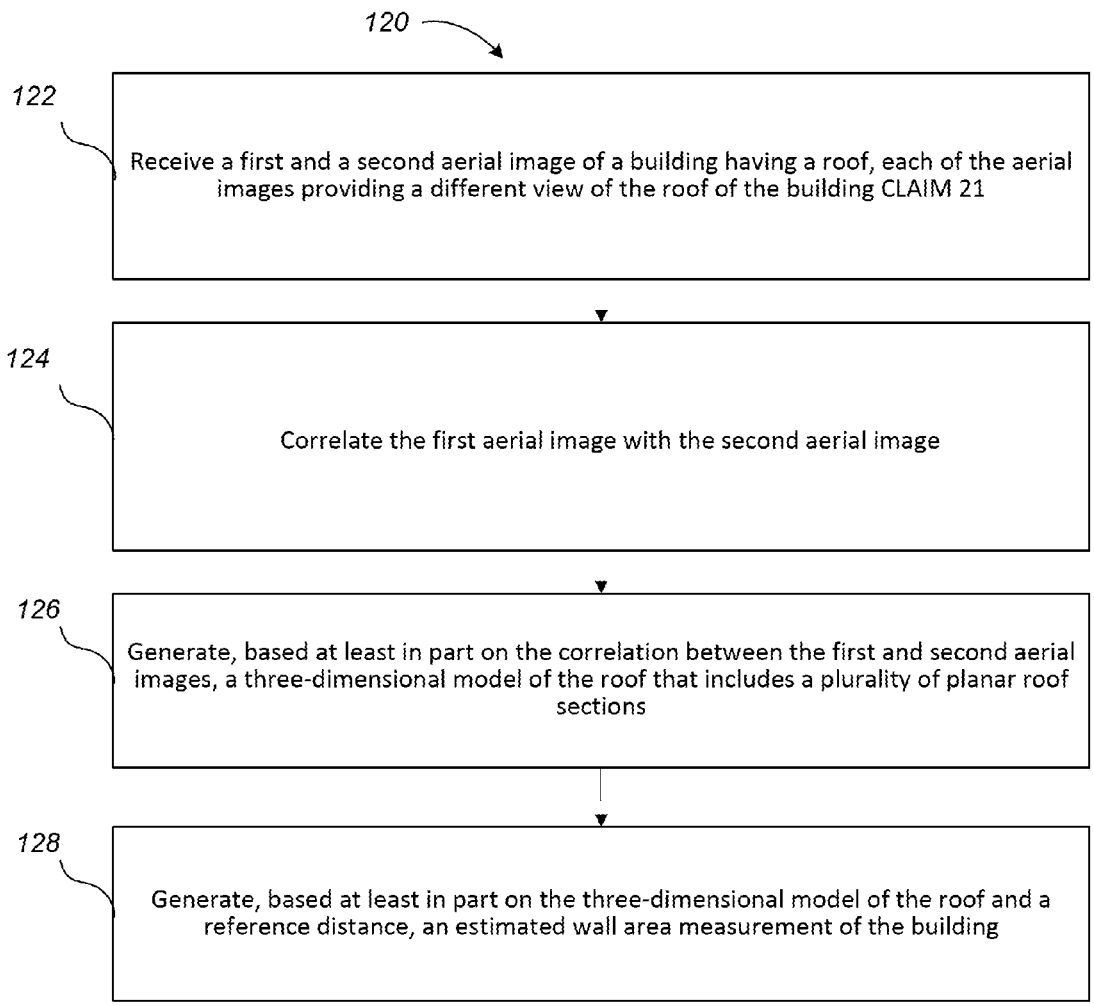
FIG. 1C is a flow diagram showing an example method of generating an estimated wall area measurement using a first a second aerial image of the building, according to one non-limiting illustrated embodiment.

FIG. 1C is a flow diagram showing an example method 120 of generating an estimated wall area measurement using a first a second aerial image of the building, according to one non-limiting illustrated embodiment.

At 122, the process correlates the first aerial image with the second aerial image. This correlation process is described in one or more of U.S. patent application Ser. No. 12/148,439 filed on Apr. 17, 2008 and entitled AERIAL ROOF ESTIMATION SYSTEM AND METHOD, U.S. Pat. No. 8,078,436 issued Dec. 13, 2011, and entitled AERIAL ROOF ESTIMATION SYSTEMS AND METHODS, U.S. patent application Ser. No. 12/467,244 filed May 15, 2009 and entitled PITCH DETERMINATION SYSTEMS AND METHODS FOR AERIAL ROOF ESTIMATION, U.S. patent application Ser. No. 12/467,250 filed May 15, 2009 and entitled CONCURRENT DISPLAY SYSTEMS AND METHODS FOR AERIAL ROOF ESTIMATION, U.S. patent application Ser. No. 13/019,228 filed Feb. 1, 2011 and entitled GEOMETRIC CORRECTION OF ROUGH WIREFRAME MODELS DERIVED FROM PHOTOGRAPHS At 124 the process generates a three-dimensional model of the roof that includes a plurality of planar roof sections that each have a corresponding slope, area, and edges. This three-dimensional model of the roof is generated based at least in part on the correlation between the first and second aerial images, which is also described in one or more of U.S. patent application Ser. No. 12/148,439 filed on Apr. 17, 2008 and entitled AERIAL ROOF ESTIMATION SYSTEM AND METHOD, U.S. Pat. No. 8,078,436 issued Dec. 13, 2011, and entitled AERIAL ROOF ESTIMATION SYSTEMS AND METHODS, U.S. patent application Ser. No. 12/467, 244 filed May 15, 2009 and entitled PITCH DETERMINATION SYSTEMS AND METHODS FOR AERIAL ROOF ESTIMATION, U.S. patent application Ser. No. 12/467,250 filed May 15, 2009 and entitled CONCURRENT DISPLAY SYSTEMS AND METHODS FOR AERIAL ROOF ESTIMATION, U.S. patent application Ser. No. 13/019,228 filed Feb. 1, 2011 and entitled GEOMETRIC CORRECTION OF ROUGH WIREFRAME MODELS DERIVED FROM PHOTOGRAPHS.

At 126 the process generates an estimated wall area measurement of the building. This estimated wall area measurement is generated based at least in part on the three-dimensional model of the roof and a measurement indicative of the distance between a reference point on the roof and the ground surface. For example, this reference distance may be used by the wall area estimation system to determine how for down to extend the walls of the building (e.g., to a ground level) when building a three dimensional model of the building In some embodiments, the entire process, or nearly the entire process, of generating estimated wall areas is automated by the system automatically recognizing these particular building features and ground features in one or more images of the building through image analysis that utilizes typical characteristics of such features as viewed from the various angles of those in the one or more images.

FIGS. 2A through 8 show example screen shots of a graphical user interface of the system for generating wall area measurements at various points in the process of building the three dimensional model of the building and generating the wall measurements (e.g., as described above with reference to FIGS. 1A-1C).

Figure 2A:
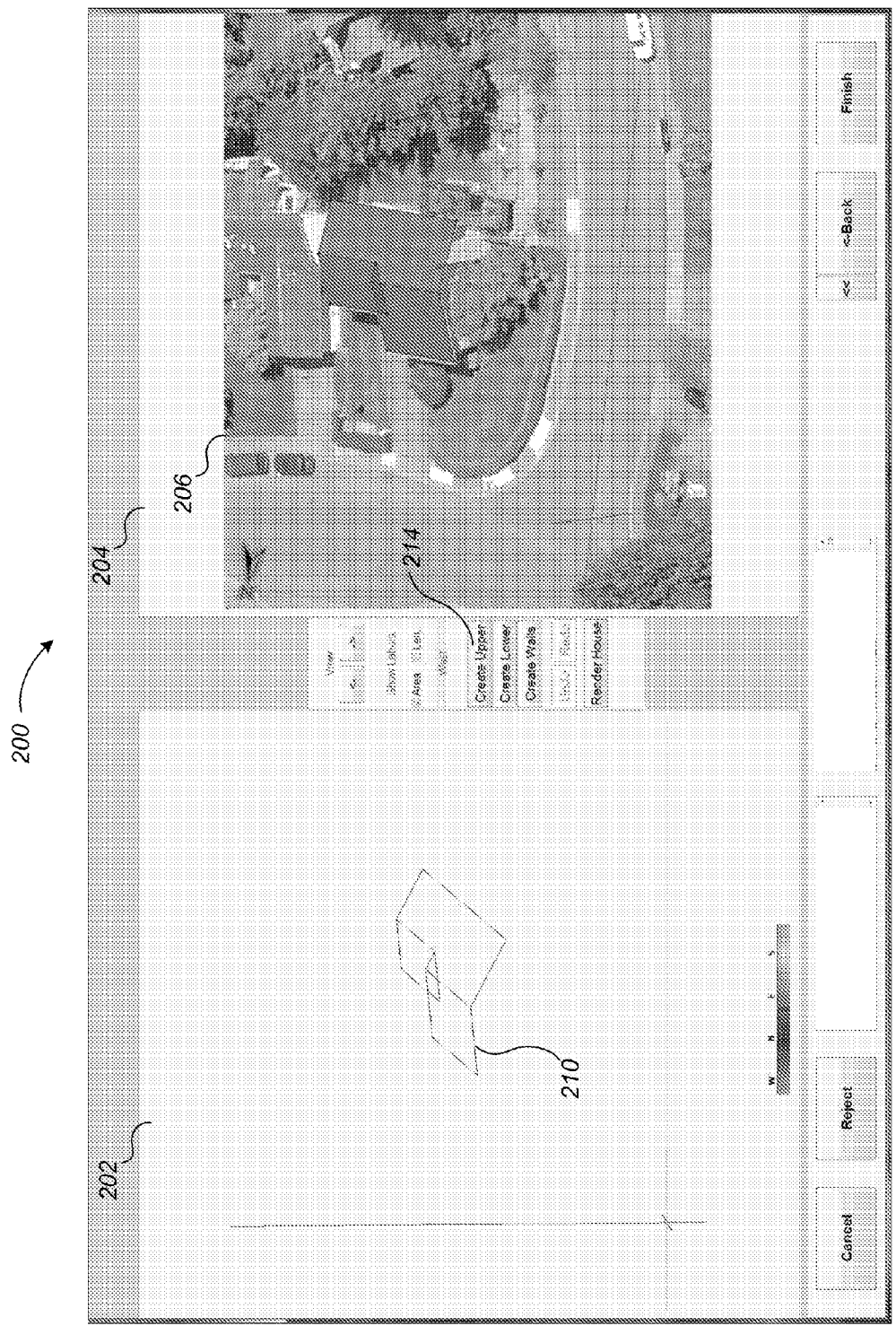
FIG. 2A is an example screenshot of a user interface of a system for generating wall area measurements showing a three dimensional model of the roof, according to one non-limiting illustrated embodiment.

FIG. 2A is an example screenshot 200 of a user interface of a system for generating wall area measurements showing a three dimensional model of the roof 210, according to one non-limiting illustrated embodiment.

Shown is a graphical user interface including two panels. The right panel 204 is displaying an aerial image of a building showing a top oblique view 206 of the building and the left panel 202 is displaying an interactive three dimensional model of the roof 210 of the building. Also note that the three dimensional model of the roof 210 is overlaid on the roof of the building shown in the aerial image on the right panel 204 in accordance with the particular angle of the top oblique view 206 of the building. In one embodiment, the interactive three dimensional model of the roof 210 is rendered in response to a user selecting the "create upper" button 214 shown in the screenshot 200.

Figure 2B:
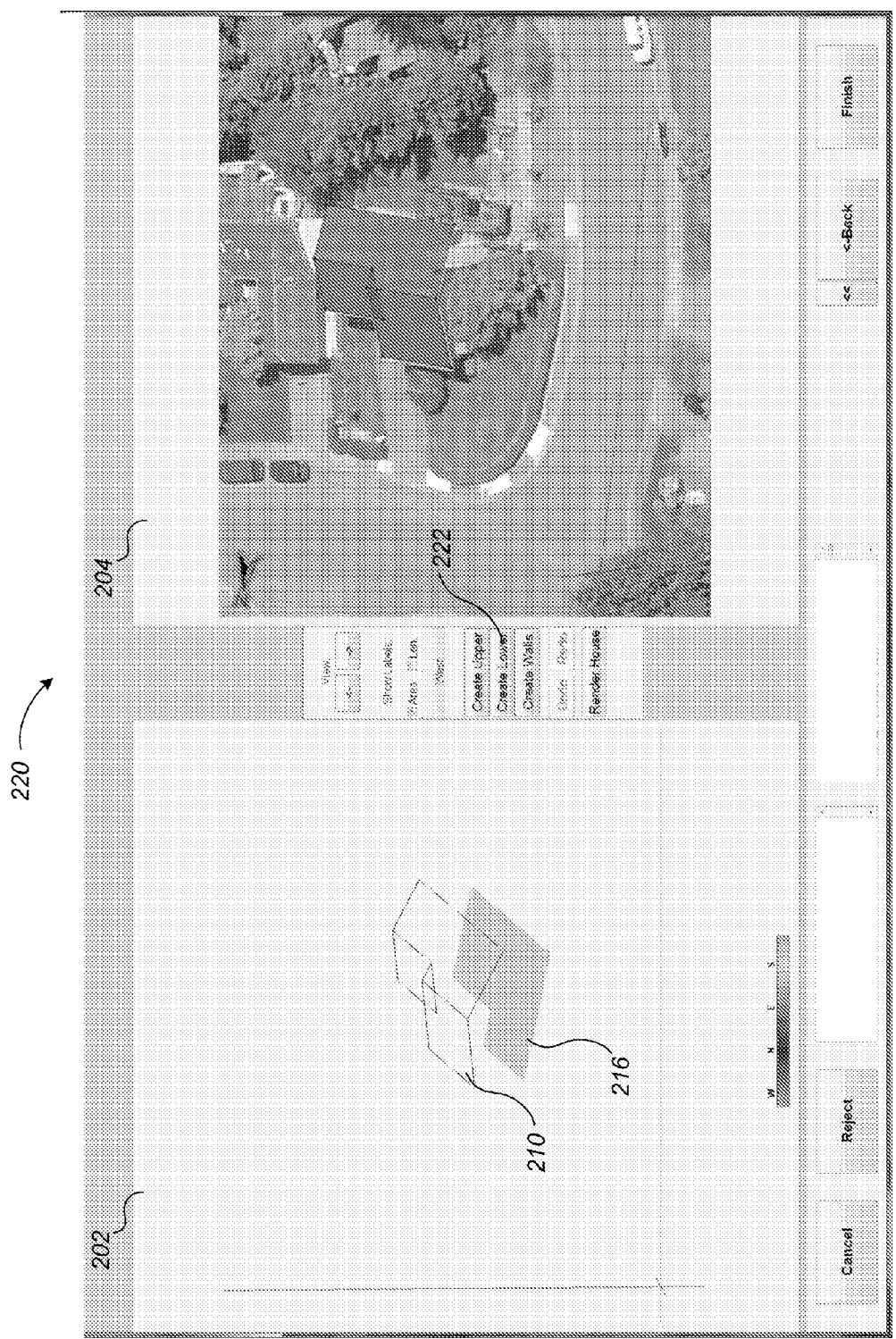
FIG. 2B is an example screenshot of the user interface of the system of FIG. 2A for generating wall area measurements showing a planar surface of the ground under the roof, according to one non-limiting illustrated embodiment.

For example, the screenshot 200 may be displayed as part of the process 110 shown in FIG. 2B in which the process initially includes the three dimensional model of the roof 210 described above as part of building the three dimensional model of the building.

FIG. 2B is an example screenshot 220 of the user interface of the system of FIG. 2A for generating wall area measurements showing a planar surface of the ground 216 under the roof 210, according to one non-limiting illustrated embodiment.

For example, the screenshot 200 may be displayed as part of the process 110 shown in FIG. 2B in which the process receives a measurement indicative of a distance between a reference point on the roof 210 and a ground surface 216. In some embodiments, a user may indicate one or more reference point(s) on the ground in the image shown in the right panel 204 (e.g., by a mouse click or other selection) to provide this measurement. In response to the user selecting the "create lower" button 222 shown on screenshot 220, the wall area estimation system will render the planar surface of the ground 216 in the corresponding area underneath the three dimensional model of the roof 210 according to the reference point selected by the user. Also, the planar surface of the ground 216 is an adjustable user interface control such that the user may change the location (or change height of sections of the perimeter, e.g. the ground surface need not be planar) of the planar surface of the ground 216 relative to the three dimensional model of the roof 210 and also change the size and orientation of the planar surface of the ground 216.

Figure 2C:
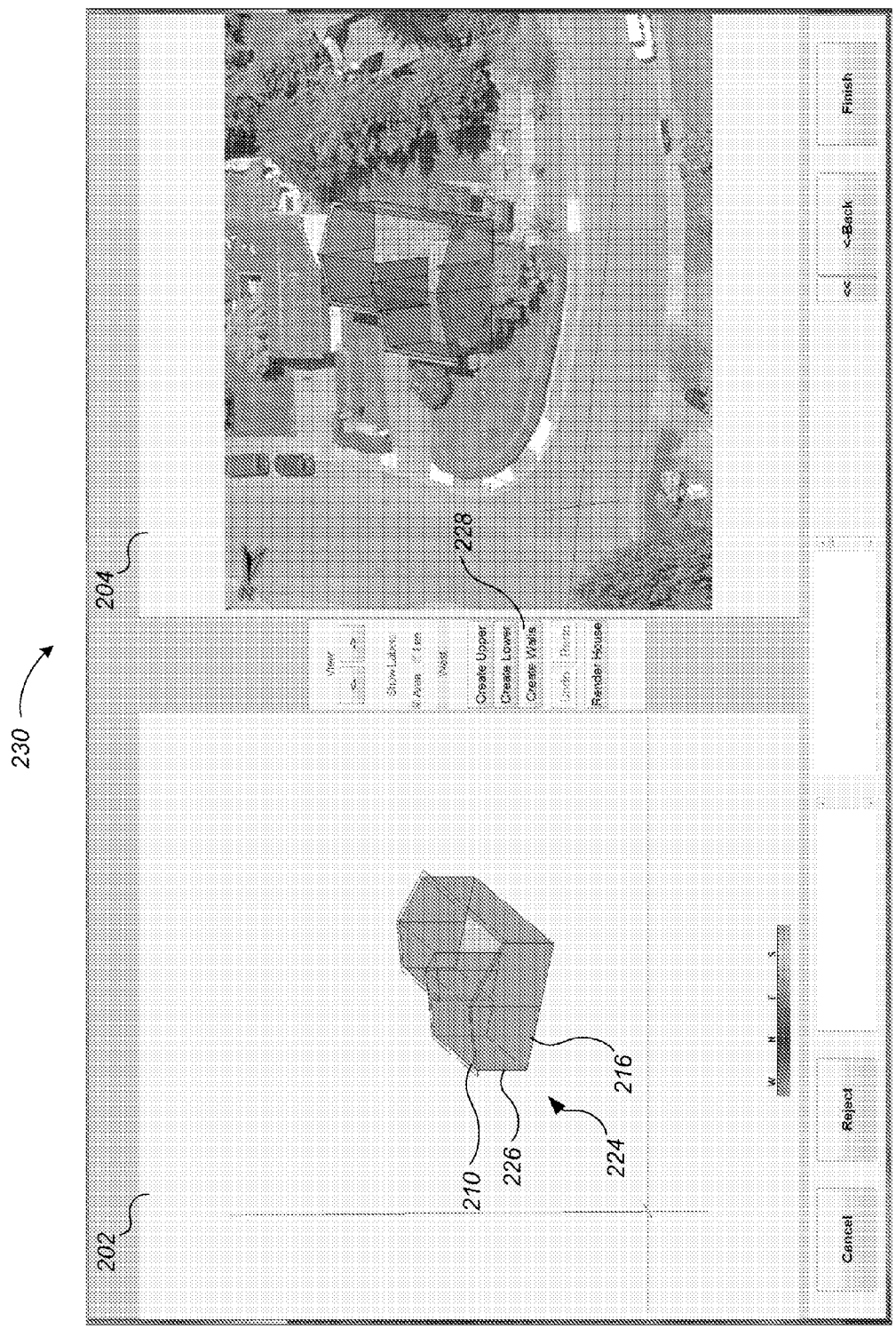
FIG. 2C is an example screenshot of the user interface of the system of FIG. 2A for generating wall area measurements showing a three dimensional model of the building generated using the three dimensional model of the roof and the planar surface of the ground under the roof shown in FIG. 2B, according to one non-limiting illustrated embodiment.

FIG. 2C is an example screenshot 230 of the user interface of the system of FIG. 2A for generating wall area measurements showing a three dimensional model of the building 224 generated using the three dimensional model of the roof 210 and the planar surface of the ground 216 under the roof shown in FIG. 2B, according to one non-limiting illustrated embodiment.

For example, the screenshot 200 may be displayed as part of the process 110 shown in FIG. 2B in which the process generates a wall 226 in the three dimensional model of the building 224 by extending the wall from along a corresponding edge of the roof 210 toward the planar surface of the ground 216.

In one embodiment, in response to a user selecting the "create walls" button 228, the wall area estimation system extends the wall 226 a distance until either intersecting planar surface of the ground 216 or intersecting another surface of the roof, according to the three dimensional model of the roof 210. In this manner, both the dimensions and shape of the wall may be built within the three dimensional model of the building 224. These may include, for example, a triangular shape of the wall 226 underneath a roof gable as shown in the three dimensional model of the roof 210. This process may be repeated for each exterior wall of the building to generate the three dimensional model of the building 224.

Once the three dimensional model of the building 224 is generated, wall area calculations are performed by the system based on the size and shape of the walls of the building in the model 224. These wall area measurements may be displayed on the graphical user interface, such as on corresponding areas of the walls in three dimensional model of the building 224, or anywhere else within the user interface. Also, the three dimensional model of the building 224 may be rotated and viewed from any angle. For example, this angle may correspond to the angle of view in the aerial image displayed on the right panel of the graphical user interface, such as shown in FIG. 3.

Figure 3:
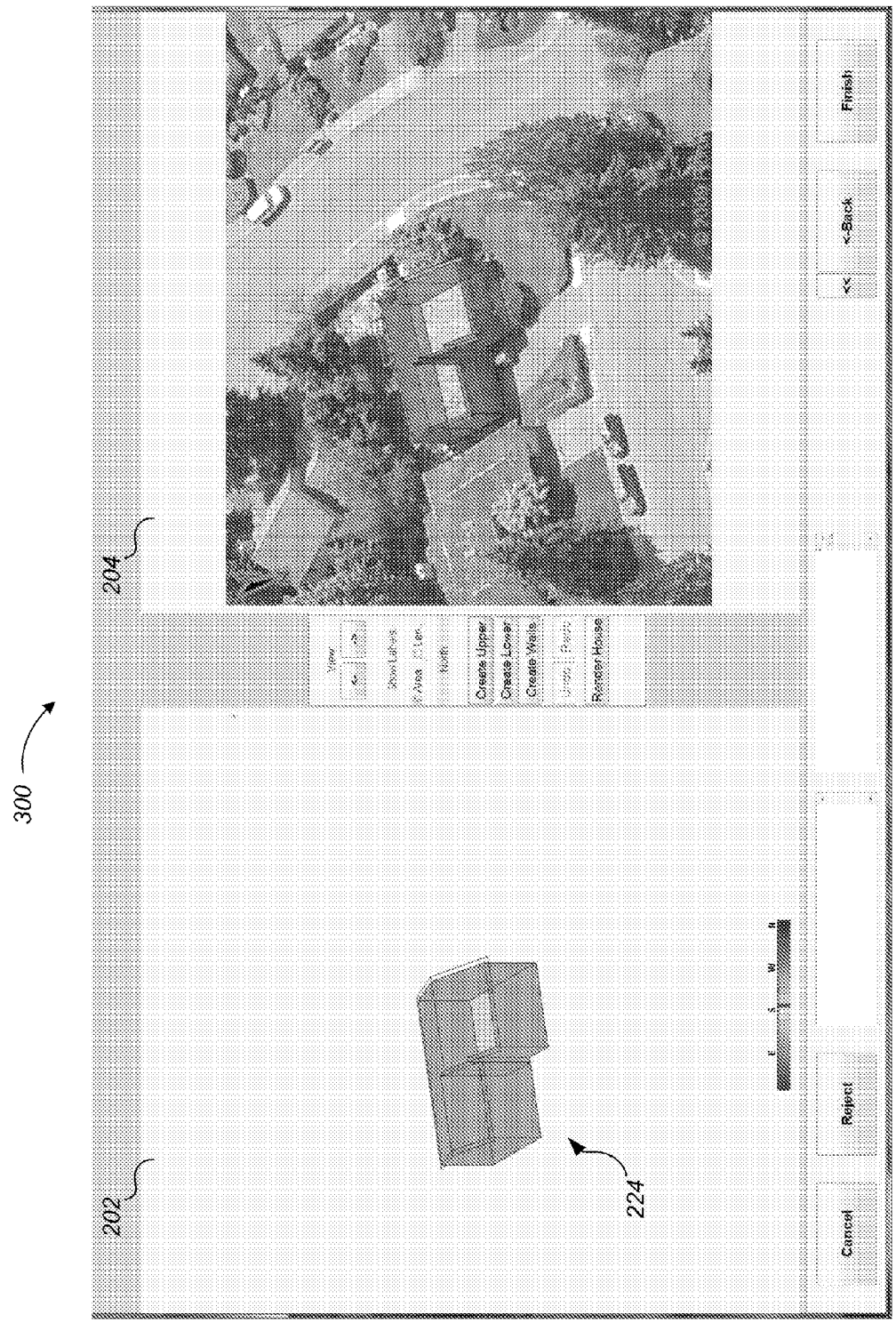
FIG. 3 is an example screenshot of the user interface of the system of FIG. 2A for generating wall area measurements showing a north side perspective view of the three dimensional model of the building of FIG. 2C, according to one non-limiting illustrated embodiment.
Figure 4:
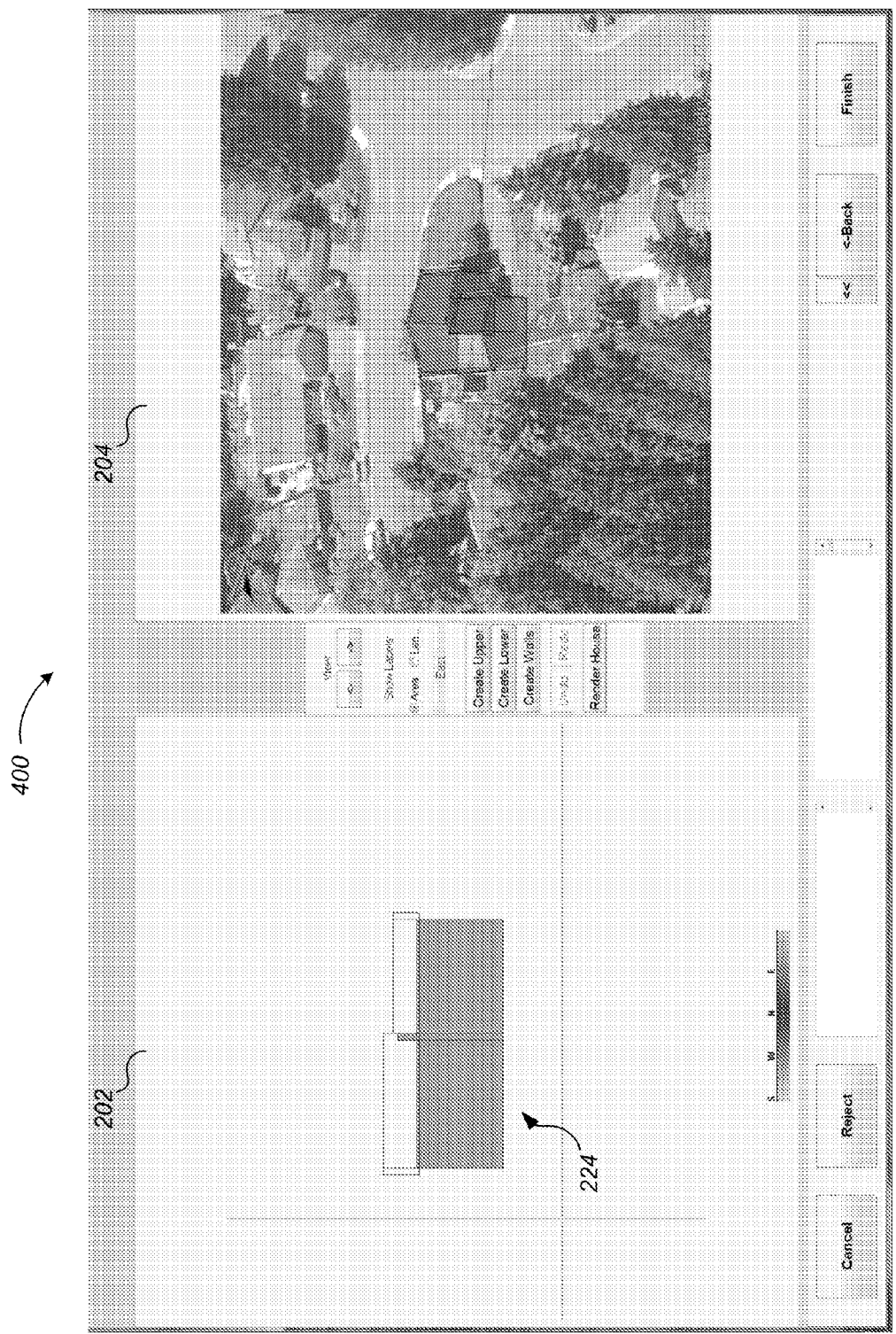
FIG. 4 is an example screenshot of the user interface of the system of FIG. 2A for generating wall area measurements showing an east side elevation view of the three dimensional model of the building of FIG. 2C, according to one non-limiting illustrated embodiment.
Figure 5:
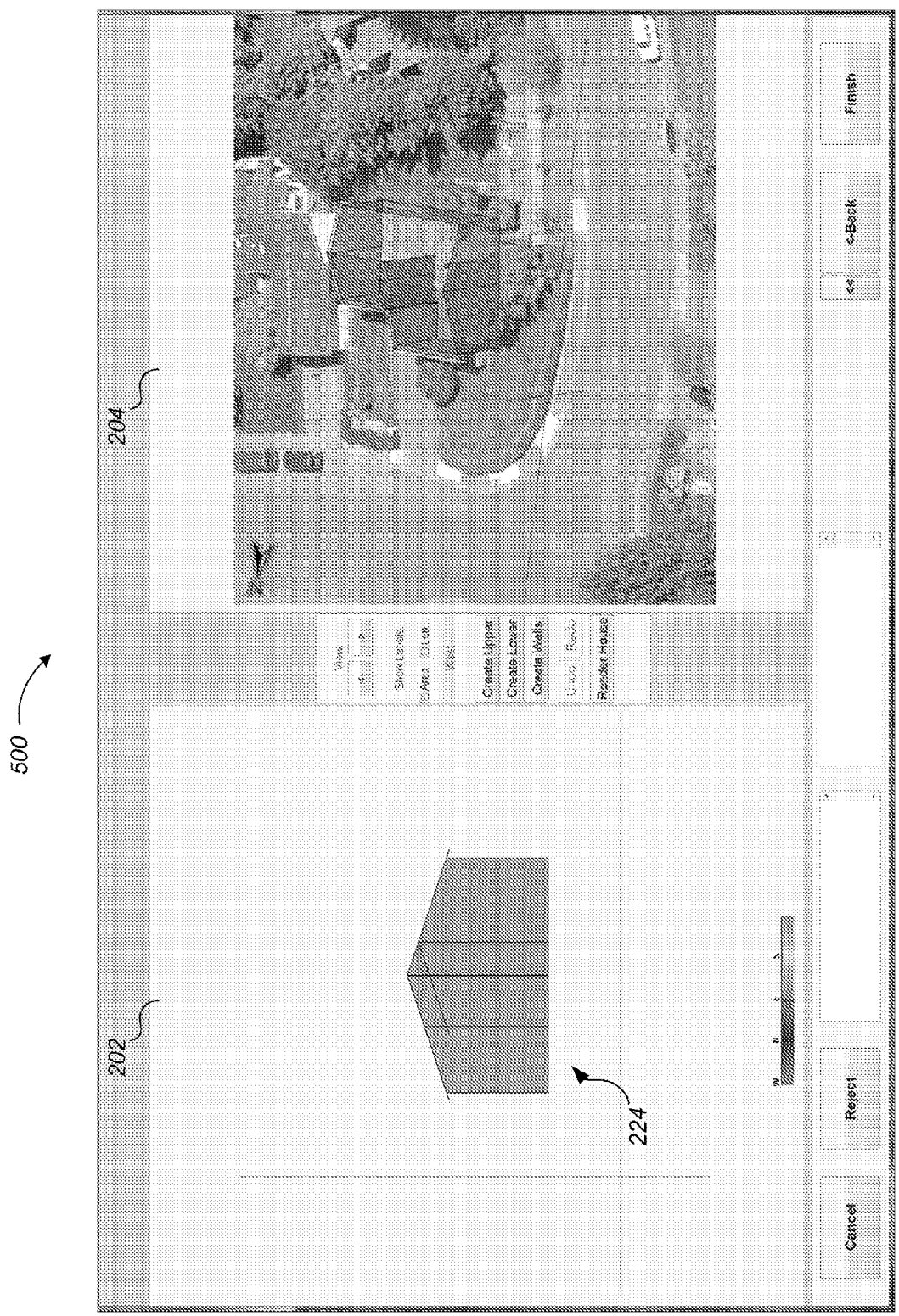
FIG. 5 is an example screenshot of the user interface of the system of FIG. 2A for generating wall area measurements showing a west side elevation view of the three dimensional model of the building of FIG. 2C, according to one non-limiting illustrated embodiment.
Figure 6:
FIG. 6 is an example screenshot of the user interface of the system of FIG. 2A for generating wall area measurements showing a top plan view of the three dimensional model of the building of FIG. 2C, according to one non-limiting illustrated embodiment.

FIG. 3 is an example screenshot 300 of the user interface of the system of FIG. 2A for generating wall area measurements showing a north side perspective view of the three dimensional model of the building 224, according to one non-limiting illustrated embodiment. Various other views from different angles and sides (e.g., south, east and west views; plan, elevation and side views, etc.) may also be rendered and displayed in the left panel 202 and the corresponding right panel 204 that includes the image of the building. For example, FIG. 4 is an example screenshot 400 of the user interface of the system of FIG. 2A showing an east side elevation view of the three dimensional model of the building 224; FIG. 5 is an example screenshot 500 of the user interface of the system of FIG. 2A showing a west side elevation view of the three dimensional model of the building 224; and FIG. 6 is an example screenshot 600 of the user interface of the system of FIG. 2A showing a top plan view of the three dimensional model of the building 224.

The three dimensional model of the building 224 can be manipulated by the user in various manners to effect changes to the model, which result in automatic corresponding changes to the wall area measurements based on the walls of the generated building model 224.

Figure 7:
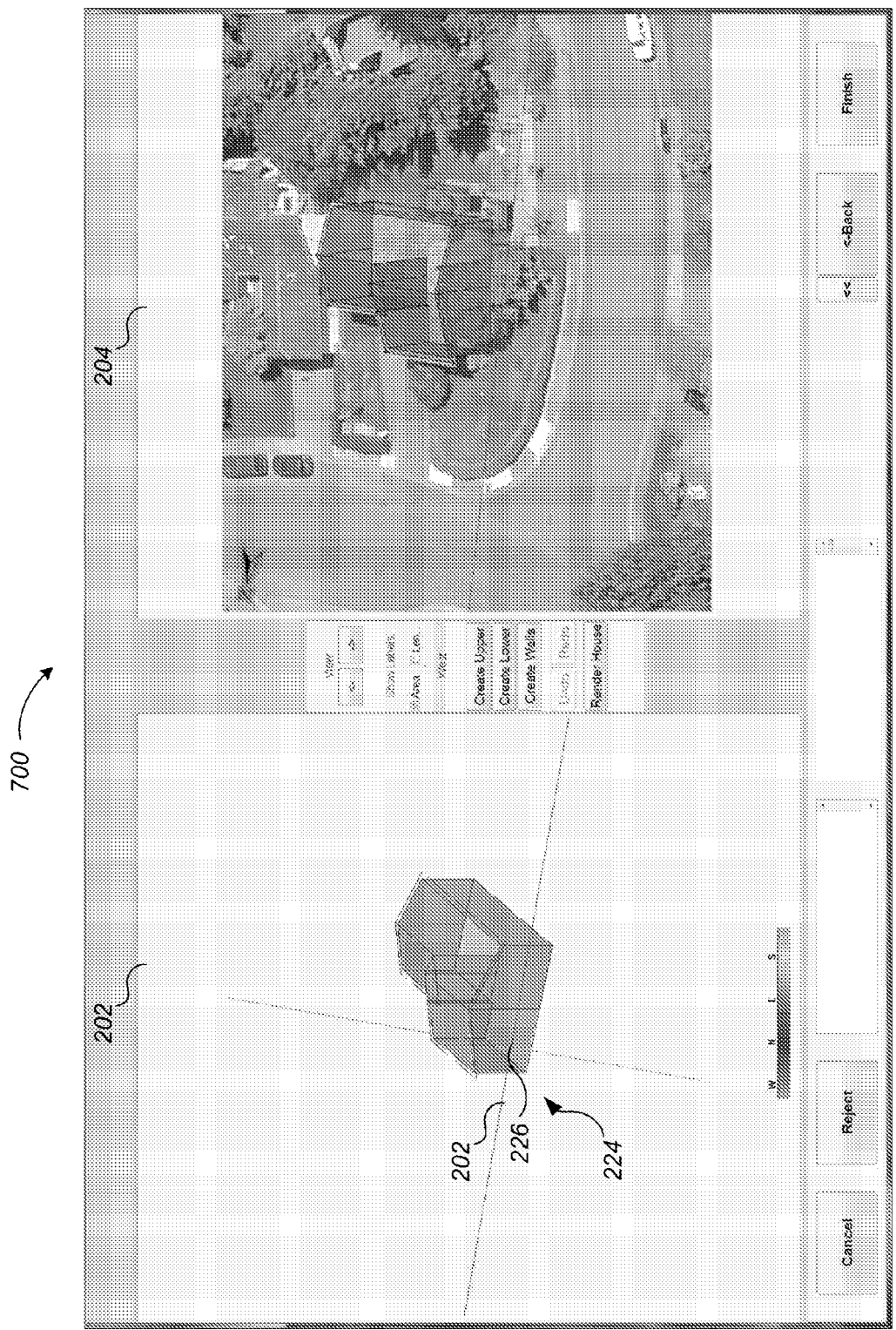
FIG. 7 is an example screenshot of the user interface of the system of FIG. 2A for generating wall area measurements showing selection of a building wall of the three dimensional model of the building of FIG. 2C, according to one non-limiting illustrated embodiment.

For example, FIG. 7 is a screenshot 700 of the user interface of the system of FIG. 2A for generating wall area measurements showing selection of a building wall 226 of the three dimensional model of the building 224, according to one non-limiting illustrated embodiment. As shown in FIG. 7, the user has moved the cross hair cursor 202 to select the wall 226 of the three dimensional model of the building 224. Note the selected wall is highlighted in panel 202

Figure 8:
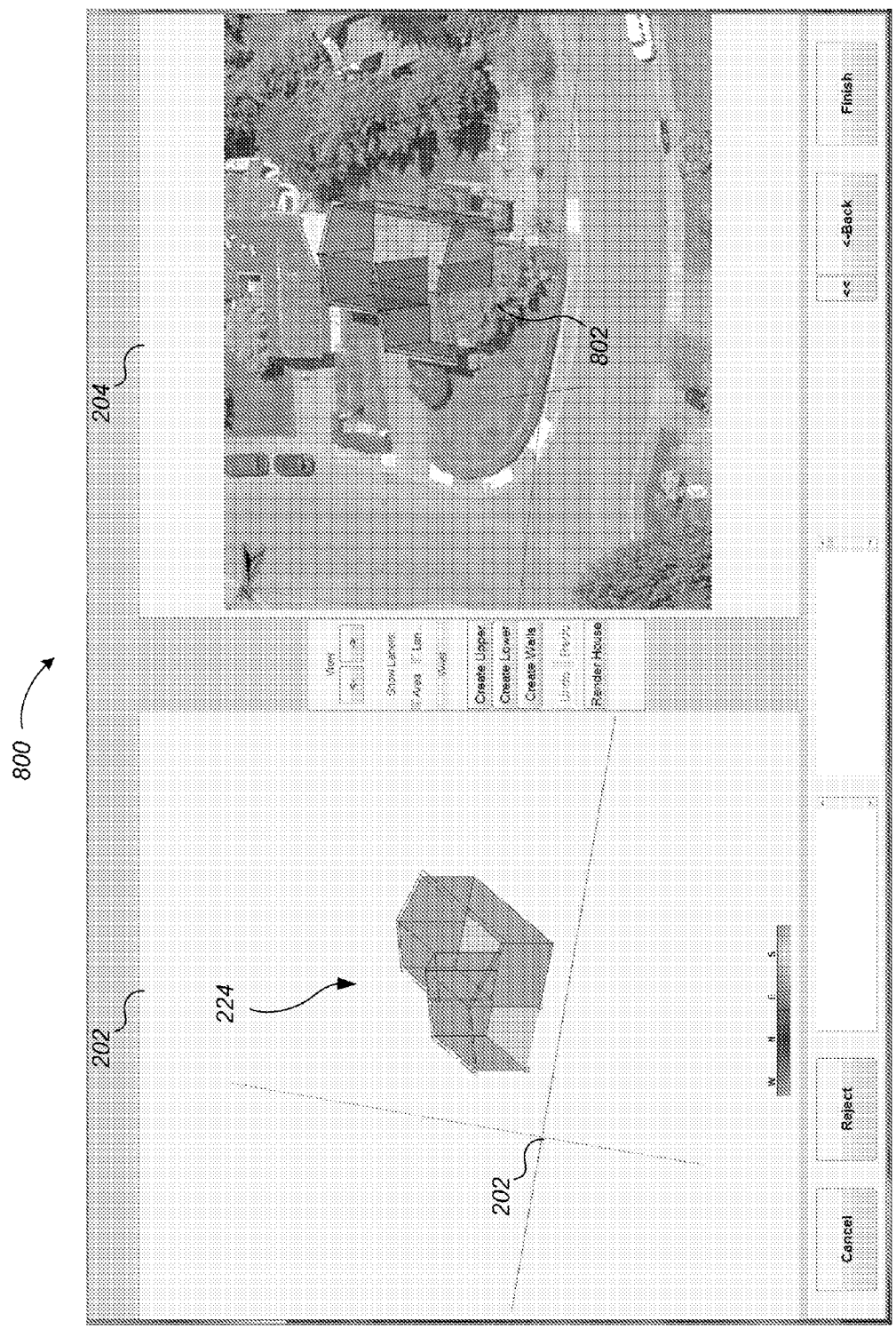
FIG. 8 is an example screenshot of the user interface of the system of FIG. 2A for generating wall area measurements showing removal of the selected building wall of the three dimensional model of the building of FIG. 7, according to one non-limiting illustrated embodiment.

FIG. 8 is an example screenshot 800 of the user interface of the system of FIG. 2A for generating wall area measurements showing removal of the selected building wall 226 of the three dimensional model of the building 224 of FIG. 7, according to one non-limiting illustrated embodiment. Once the wall is removed, it is also removed from the three dimensional model of the building 224 overlaid on the image of the building in the right panel 204, causing the tree 802 previously blocked by the wall 226 to be revealed in the image. As a result, the total area of all the walls of the house may be reduced by the area of the wall 226 that was removed from the building model 224.

In some embodiments, multiple panels of the user interface may each show a different view of the three dimensional model of the building 224. When the user changes the model using the graphical user interface in any one panel, the corresponding change will appear in the other panels showing the change as seen from the different corresponding view of each respective panel. For example, if the user places a graphical user interface element representing a window on one of the walls of the three dimensional model of the building 224, then that window will be visible from the different corresponding view of each respective panel. In this manner, the correct placement of the object or change to the three dimensional model of the building 224 may be visually verified with the image of the building according to the angle of the building in the image.

The resulting wall measurements, roof measurements, measurements of areas missing from the wall, etc., generated by the wall estimation system may be used to generate a wall estimate report, or a combined roof and wall estimate report. The estimate report may include various different identifiers indicating different features and measurements displayed on images and/or line drawings of the building and/or in different areas of the report based on the generated three dimensional model of the building. A non-limiting example of such a report is provided in Appendix A attached hereto. In some embodiments, the three dimensional model of the building 224 described herein, or some version thereof, may also be provided in the report. For example, the three dimensional model of the building 224 may be overlaid on an image of the building in the report. The report may be communicated or provided electronically by the wall estimation system or other $3^{rd}$ party system in various configurations and formats required by the insurance, real estate and construction industries, and/or printed and mailed. This report may also be represented and communicated in different data formats, such as Extensible Markup Language (XML) files or standard three dimensional (3D) model and/or computer-aided design (CAD) exchange formats such as Virtual Reality Modeling Language (VRML), Drawing Interchange Format, or Drawing Exchange Format (DXF) and the like.

In some embodiments, the wall area estimation system may also generate associations between one or more areas of a wall with one or more wall characteristics. These associations may be included in the report as indications (markings, designations, numbers, markings overlaid on line drawings or images of the wall, etc.) of the associations between these areas of the wall and the particular wall characteristics. The wall characteristics may include characteristics regarding, but not limited to, one or more of: wall material type, wall construction type, wall color, wall covering type, wall paint type, wall siding type, wall façade type, wall damage, wall damage type, and extent of wall damage, etc. For example, the report or user interface system may include indications of portions or areas of the wall that are made of a particular material such as brick or stucco and/or that appear damaged vs. not damaged, or walls that are painted green vs. blue, etc. The wall area estimation system may also generate an estimated area of each of the one or more areas of the wall associated with particular wall characteristics and include these area measurements as indications on the graphical user interface of the wall estimation system and/or in the report.

Figure 9:
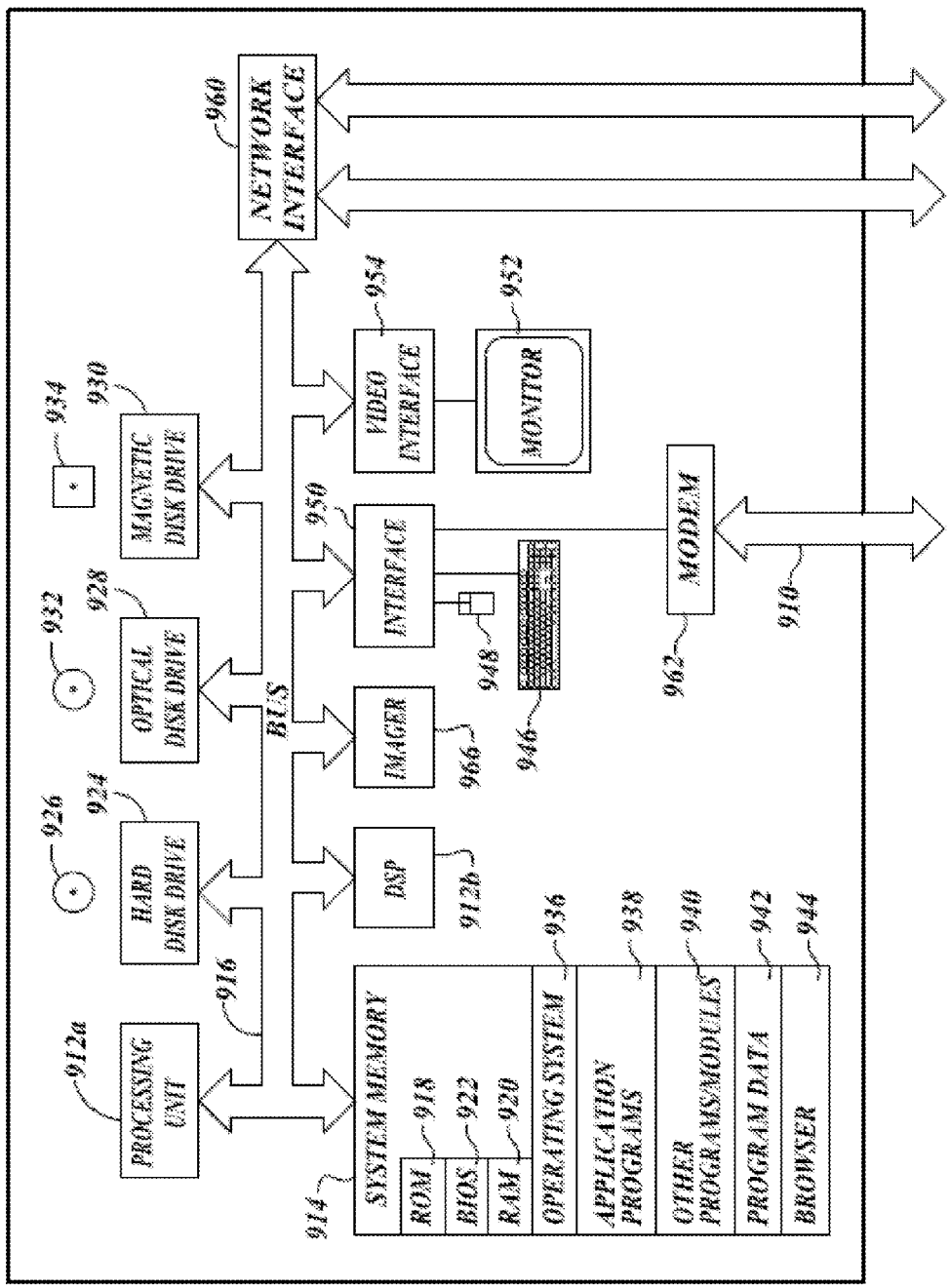
FIG. 9 is a schematic diagram of a computing environment in which systems and methods for estimation of building wall area may be implemented or of which they may be a part.

FIG. 9 is a schematic diagram of a computing environment in which systems and methods for estimation of building wall area may be implemented or of which they may be a part. For example, processes 100, 110 and 120 described above in conjunction with FIGS. 1A-1C may be performed or implemented by, for example, one or more software modules or components or any combination of suitable hardware, firmware or software components or devices including those that are a part of, stored in, or configure the computing environment of FIG. 9. Also, the graphical user interface functions and features of the wall area estimation system may be performed or implemented by, for example, one or more software modules or components or any combination of suitable hardware, firmware or software components or devices including those that are a part of, stored in, or configure the computing environment of FIG. 9.

The computing environment 900 will at times be referred to in the singular herein, but this is not intended to limit the embodiments to a single device since in typical embodiments there may be more than one computer system or device involved. Unless described otherwise, the construction and operation of the various blocks shown in FIG. 9 are of conventional design. As a result, such blocks need not be described in further detail herein, as they will be understood by those skilled in the relevant art.

The computing environment 900 may include one or more processing units 912a, 912b (collectively 912), a system memory 914 and a system bus 916 that couples various system components including the system memory 914 to the processing units 912. The processing units 912 may be any logic processing unit, such as one or more central processing units (CPUs) 912a, digital signal processors (DSPs) 912b, digital video or audio processing units such as coder-decoders (codecs) or compression-decompression units, application-specific integrated circuits (ASICs), field programmable gate arrays (FPGAs), etc. The system bus 916 can employ any known bus structures or architectures, including a memory bus with memory controller, a peripheral bus, and a local bus. The system memory 914 includes read-only memory ("ROM") 918 and random access memory ("RAM") 920. A basic input/output system ("BIOS") 922, which can form part of the ROM 918, contains basic routines that help transfer information between elements within the computing environment 900, such as during start-up.

The computing environment 900 may include a hard disk drive 924 for reading from and writing to a hard disk 926 (including a solid state memory device), an optical disk drive 928 for reading from and writing to removable optical disks 932, and/or a magnetic disk drive 930 for reading from and writing to magnetic disks 934. The optical disk 932 can be a CD-ROM, while the magnetic disk 934 can be a magnetic floppy disk or diskette. The hard disk drive 924, optical disk drive 928 and magnetic disk drive 930 may communicate with the processing unit 912 via the system bus 916. The hard disk drive 924, optical disk drive 928 and magnetic disk drive 930 may include interfaces or controllers (not shown) coupled between such drives and the system bus 916, as is known by those skilled in the relevant art. The drives 924, 928 and 930, and their associated computer-readable storage media 926, 932, 934, may provide nonvolatile and non-transitory storage of computer readable instructions, data structures, program modules and other data for the computing environment 900. Although the depicted computing environment 900 is illustrated employing a hard disk 924, optical disk 928 and magnetic disk 930, those skilled in the relevant art will appreciate that other types of computer-readable storage media that can store data accessible by a computer may be employed, such as magnetic cassettes, flash memory, solid state drives, digital video disks ("DVD"), Bernoulli cartridges, RAMs, ROMs, smart cards, etc. For example, computer-readable storage media may include, but is not limited to, random access memory (RAM), read-only memory (ROM), electrically erasable programmable read-only memory (EEPROM), flash memory, compact disc ROM (CD-ROM), digital versatile disks (DVD) or other optical disk storage, magnetic cassettes, magnetic tape, magnetic disk storage or other magnetic storage devices, solid state memory or any other medium which can be used to store the desired information and which may be accessed by processing unit 912a.

Program modules can be stored in the system memory 914, such as an operating system 936, one or more application programs 938, other programs or modules 940 and program data 942. Application programs 938 may include instructions that cause the processor(s) 912 to perform generating digital roof models, generating roof and wall area measurements, and store and display input images or images generated by creating digital roof models and generating roof and wall area measurements, including the processes described herein. Other program modules 940 may include instructions for handling security such as password or other access protection and communications encryption. The system memory 914 may also include communications programs, for example, a Web client or browser 944 for permitting the computing environment 900 to access and exchange data including digital images, roof measurements and other building data with sources such as Web sites of the Internet, corporate intranets, extranets, or other networks and devices, as well as other server applications on server computing systems. The browser 944 in the depicted embodiment is markup language based, such as Hypertext Markup Language (HTML), Extensible Markup Language (XML) or Wireless Markup Language (WML), and operates with markup languages that use syntactically delimited characters added to the data of a document to represent the structure of the document. A number of Web clients or browsers are commercially available such as those from Mozilla, Google, and Microsoft of Redmond, Wash.

While shown in FIG. 9 as being stored in the system memory 914, the operating system 936, application programs 938, other programs/modules 940, program data 942 and browser 944 can be stored on the hard disk 926 of the hard disk drive 924, the optical disk 932 of the optical disk drive 928 and/or the magnetic disk 934 of the magnetic disk drive 930.

An operator can enter commands and information into the computing environment 900 through input devices such as a touch screen or keyboard 946 and/or a pointing device such as a mouse 948, and/or via a graphical user interface in order to receive, process, store and send data on which wall area measurement estimation has been or will be performed as described herein. Other input devices can include a microphone, joystick, game pad, tablet, scanner, etc. These and other input devices are connected to one or more of the processing units 912 through an interface 950 such as a serial port interface that couples to the system bus 916, although other interfaces such as a parallel port, a game port or a wireless interface or a universal serial bus ("USB") can be used. A monitor 952 or other display device is coupled to the system bus 916 via a video interface 954, such as a video adapter which may be configured to display images used by or generated by wall area measurement estimation as described herein. The computing environment 900 can include other output devices, such as speakers, printers, etc.

The computing environment 900 can operate in a networked environment using logical connections to one or more remote computers and/or devices. For example, the computing environment 900 can operate in a networked environment using logical connections to one or more other computing systems, mobile devices and other service providers or information servers that provide the digital images in various format or by other electronic delivery methods. Communications may be via a wired and/or wireless network architecture, for instance wired and wireless enterprise-wide computer networks, intranets, extranets, telecommunications networks, cellular networks, paging networks, and other mobile networks.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A computing system for generating estimated wall area measurements, the computing system comprising:
at least one computer processor;
a graphical user interface; and
a memory coupled to the at least one computer processor, the memory having computer executable instructions stored on the memory, that, when executed, cause the at least one computer processor to:
generate a three dimensional roof model of a roof of a building, the roof model having measurements of the roof including information regarding one or more edges of the roof;
render, on the graphical user interface, an aerial image of the building showing an oblique view of the building;
render, on the graphical user interface, the roof model overlaid on the roof of the building shown in the aerial image and aligned with the oblique view of the building;
receive one or more measurements indicative of one or more distances between one or more reference points on the roof and a ground surface on which the building rests, based at least in part on receipt of an indication from a user of one or more reference points selected in the aerial image rendered on the graphical user interface and indicative of one or more points on the ground surface;
generate the ground surface in a corresponding area underneath the roof model based at least in part on the one or more measurements indicative of one or more distances between one or more reference points on the roof and the ground surface;
generate, based at least in part on the roof measurements and the ground surface, a three dimensional building model of the building based at least partly on creating one or more wall for the building model by extending the one or more wall from along corresponding edges of the roof toward the ground surface until either intersecting the ground surface or intersecting another surface of the roof in the roof model;
render, on the graphical user interface, the building model overlaid on the building shown in the aerial image and aligned with the oblique view of the building;
generate an estimated wall area measurement of the building from the building model; and
output a wall area measurement estimate report having the estimated wall area measurement of the building thereon, wherein the generated wall estimation report is provided for repair and/or constructing a structure of the building.

2. The computing system of claim 1, wherein the computer executable instructions, when executed, further cause the at least one computer processor to:
render the three dimensional building model of the building within the graphical user interface;
provide selectable user interface elements within the graphical user interface configured to be overlaid on areas on the one or more wall, the user interface elements having dimensions corresponding to areas missing from the one or more wall;
receive indications regarding locations on the one or more wall on which one or more of the selectable user interface elements have been overlaid; and
subtract an amount from the estimated wall area measurement of the building corresponding based on the received indications regarding locations on the one or more wall on which one or more of the selectable user interface elements have been overlaid.

3. The computing system of claim 1, wherein to generate an estimated wall area measurement of the building from the building model includes:
rendering the three dimensional building model of the building within the graphical user interface;
providing selectable user interface elements within the graphical user interface configured to be utilized by a user to cut out one or more portions of the one or more wall in the displayed three dimensional building model;
receiving indications regarding locations on the one or more wall on which one or more of the selectable user interface elements have been utilized to cut out one or more portions of the one or more wall; and
determining an area of the one or more wall by calculating an area of a shape of the one or more wall formed based on the received indications regarding locations on the one or more wall on which the one or more of the selectable user interface elements have been utilized to cut out the one or more portions of the one or more wall.

4. The computing system of claim 3, wherein the graphical user interface includes windows each displaying different views of the three dimensional building model that are configured to concurrently show modifications being made by a user to one or more walls of the three dimensional building model from a corresponding perspective of each of the different views.

5. The computing system of claim 3, wherein the dimensions corresponding to areas missing from the one or more wall are those of a predefined window size or a predefined door size.

6. The computing system of claim 1, wherein the computer executable instructions, when executed, further cause the at least one computer processor to:
  subtract an amount from the estimated wall area measurement of the building corresponding to an area on the one or more wall of the building indicated as an area missing from the one or more wall.

7. The computing system of claim 6, wherein the area on the one or more wall of the building indicated as an area missing from the one or more wall is an area corresponding to a window or a door of the building.

8. The computing system of claim 1, wherein the computer executable instructions, when executed, further cause the at least one computer processor to:
  receive an indication that the one or more wall of the building for which the estimated wall area measurement is generated is at least partially obstructed by an object in an image of the one or more wall used to generate the three dimensional roof model; and
  subtract a predefined percentage from the estimated wall area measurement of the building corresponding to a size of the partial obstruction to account for possible areas missing from the one or more wall which may be obstructed in the image by the object in the image.

9. The computing system of claim 1 wherein the three dimensional model of the roof is based on a correlation between two aerial images of the roof.

10. The computing system of claim 1, wherein the wall area measurement estimate report includes multiple line drawings of the building, each from a different perspective annotated with numerical values that indicate corresponding estimated wall area measurements for walls visible in the respective perspective.

11. The computing system of claim 10 wherein the wall area measurement estimate report includes roof measurements including pitch annotated on corresponding roof sections.

12. A computer-implemented method for generating estimated wall area measurements, the method comprising:
  generating, by a computer processor of a system for generating estimated wall area measurements, a three dimensional roof model of a roof of a building as part of a three dimensional building model of the building, the roof model having measurements of the roof including information regarding one or more edges of the roof;
  rendering, on a graphical user interface, an aerial image of the building showing an oblique view of the building;
  rendering, on the graphical user interface, the roof model overlaid on the roof of the building shown in the aerial image and aligned with the oblique view of the building;
  receiving one or more measurements indicative of one or more distances between one or more reference points on the roof and a ground surface on which the building rests, based at least in part on receipt of an indication from a user of one or more reference points selected in the aerial image rendered on the graphical user interface and indicative of one or more points on the ground surface;
  generating, by the computer processor, the ground surface in a corresponding area underneath the roof model based at least in part on the one or more measurements indicative of one or more distances between one or more reference points on the roof and the ground surface;
  generating, by the computer processor, a wall within the three dimensional building model by extending the wall in the three dimensional building model from along or near an edge of the roof represented by the three dimensional roof model toward the ground surface, the wall extending a distance until either intersecting a level of the ground surface, or intersecting another surface of the roof, according to the three dimensional roof model;
  rendering, on the graphical user interface, the building model overlaid on the building shown in the aerial image and aligned with the oblique view of the building;
  using, by the computer processor, dimensions of the wall generated in the three dimensional building model to determine an area of the wall; and
  outputting, by the computer processor of the system for generating estimated wall area measurements, a wall estimation report having the determined area of the wall thereon and wherein the generated wall estimation report is provided for repair and/or constructing a structure of the building.

* * * * *